US011901007B2

(12) United States Patent
Oowada et al.

(10) Patent No.: US 11,901,007 B2
(45) Date of Patent: Feb. 13, 2024

(54) POSITIVE TCO VOLTAGE TO DUMMY SELECT TRANSISTORS IN 3D MEMORY

(71) Applicant: SanDisk Technologies LLC, Addison, TX (US)

(72) Inventors: Ken Oowada, Fujisawa (JP); Natsu Honda, Sagamihara (JP)

(73) Assignee: SanDisk Technologies LLC, Addison, TX (US)

(*) Notice: Subject to any disclaimer, the term of this patent is extended or adjusted under 35 U.S.C. 154(b) by 116 days.

(21) Appl. No.: 17/507,119

(22) Filed: Oct. 21, 2021

(65) Prior Publication Data

US 2023/0128177 A1  Apr. 27, 2023

(51) Int. Cl.
| G11C 16/04 | (2006.01) |
| G11C 16/14 | (2006.01) |
| G11C 16/34 | (2006.01) |
| H01L 25/065 | (2023.01) |
| H10B 43/10 | (2023.01) |
| H10B 43/27 | (2023.01) |

(52) U.S. Cl.
CPC .......... *G11C 16/0483* (2013.01); *G11C 16/14* (2013.01); *G11C 16/3445* (2013.01); *H01L 25/0657* (2013.01); *H01L 2225/06562* (2013.01); *H10B 43/10* (2023.02); *H10B 43/27* (2023.02)

(58) Field of Classification Search
CPC . G11C 16/0483; G11C 16/14; G11C 16/3445; H01L 25/0657; H01L 2225/06562; H10B 43/10; H10B 43/27

USPC ...................................................... 365/185.17
See application file for complete search history.

(56) References Cited

U.S. PATENT DOCUMENTS

| 7,463,528 B2 | 12/2008 | Mokhlesi et al. |
| 9,153,325 B2* | 10/2015 | Maejima ............... G06F 3/0614 |
| 9,406,781 B2* | 8/2016 | Rabkin ................... H10B 43/27 |
| 9,443,605 B1 | 9/2016 | Chen et al. |
| 9,679,661 B1* | 6/2017 | Guo ........................ G11C 16/08 |
| 9,922,705 B1 | 3/2018 | Diep et al. |
| 9,922,714 B1 | 3/2018 | Yu et al. |
| 10,541,037 B2* | 1/2020 | Zhao ....................... H10B 41/27 |
| 10,559,368 B1* | 2/2020 | Yang ....................... G11C 16/08 |
| 10,573,388 B2 | 2/2020 | Gupta et al. |
| 10,910,060 B1 | 2/2021 | Wu et al. |
| 11,074,976 B2 | 7/2021 | Rabkin et al. |

(Continued)

*Primary Examiner* — Tha-O H Bui
(74) *Attorney, Agent, or Firm* — Vierra Magen Marcus LLP

(57) ABSTRACT

Technology for applying a positive temperature coefficient (Tco) voltage to a control terminal of a dummy select transistor. The dummy select transistor resides on a NAND string having non-volatile memory cells and a regular select transistor. The dummy select transistor is typically ON (or conductive) during memory operations such as selected string program, read, and verify. In an aspect, the positive Tco voltage is applied to the control terminal of a dummy select transistor during a program operation. Applying the positive Tco voltage during program operations reduces or eliminates program disturb to the dummy select transistor. In some aspects, the dummy select transistor is used to generate a gate induced drain leakage (GIDL) current during an erase operation. In some aspects, the dummy select transistor is a depletion mode transistor.

20 Claims, 23 Drawing Sheets

(56) References Cited

U.S. PATENT DOCUMENTS

2017/0330631 A1* 11/2017 Diep ..................... G11C 7/04
2019/0006020 A1   1/2019 Sundaresan et al.
2021/0125670 A1   4/2021 Shibata et al.

* cited by examiner

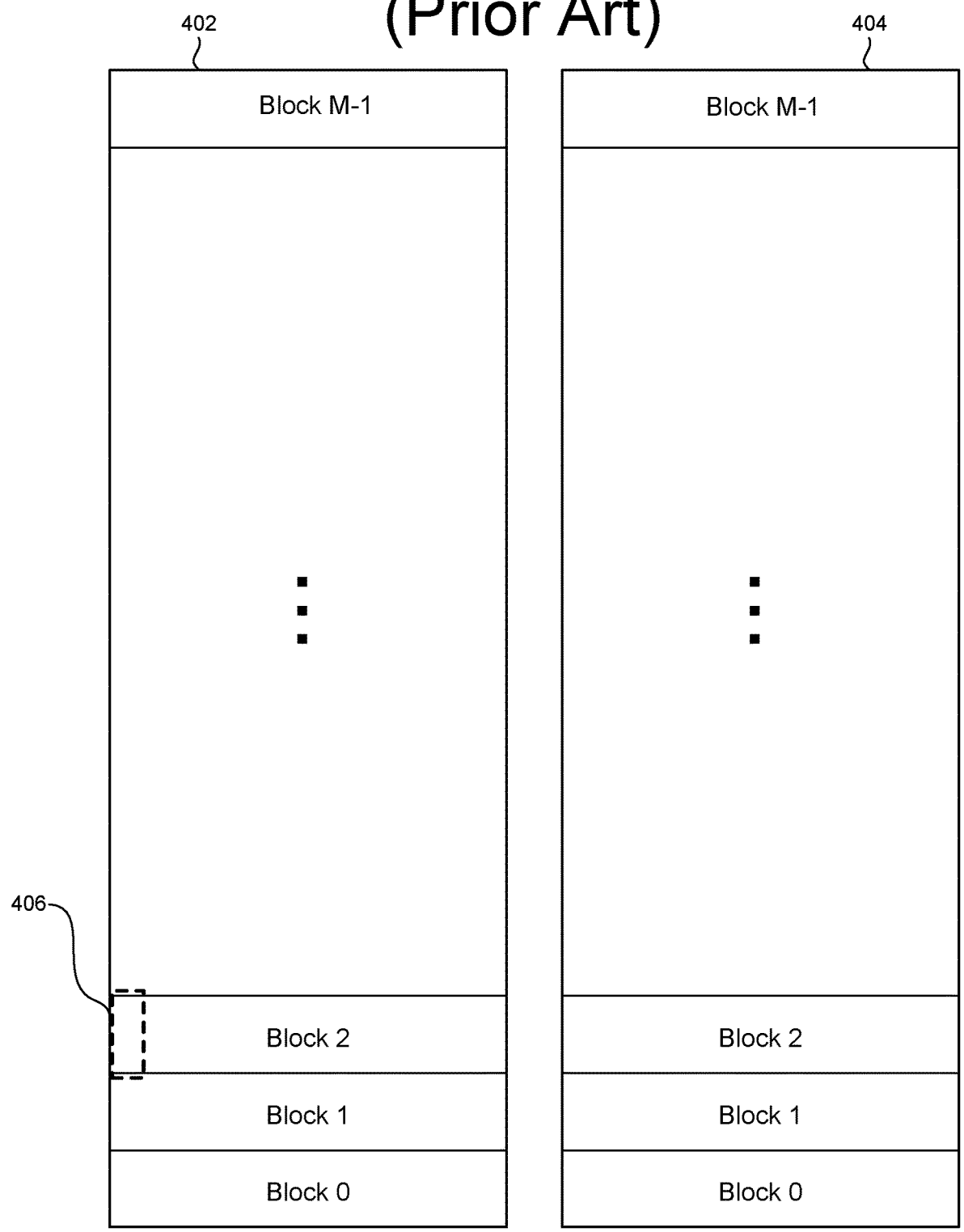

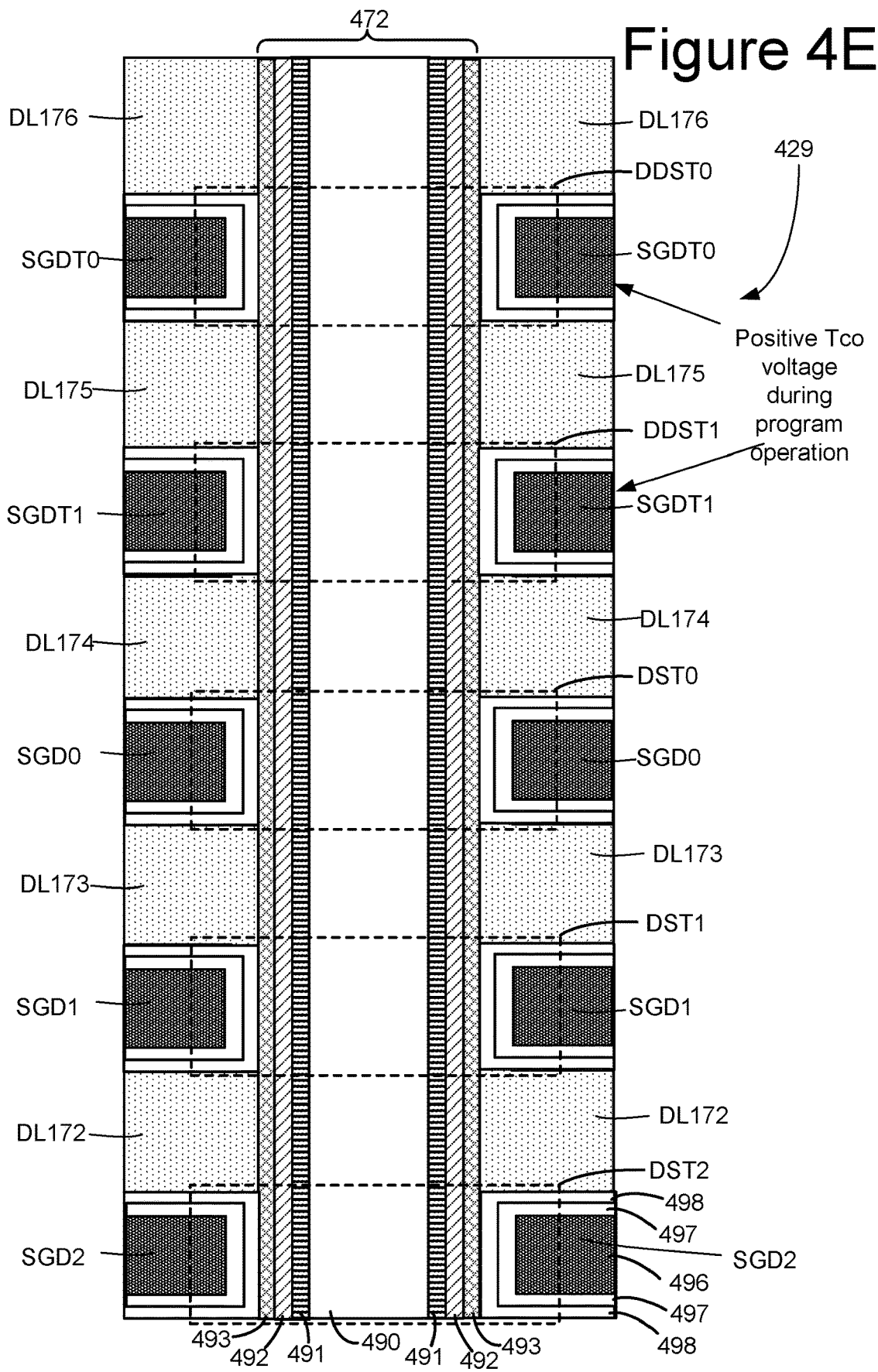

POSITIVE TCO VOLTAGE TO DUMMY SELECT TRANSISTORS IN 3D MEMORY

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at the GIDL current is generated each end of the string. Typically, such strings are referred to as NAND strings. The non-volatile memory cells may also be referred to as non-volatile memory cell transistors, with the channels of the non-volatile memory cell transistors collectively being referred to as a NAND string channel. A NAND string may have a drain side select gate at an end adjacent to a bit line and a source side select gate at the end adjacent to a source line. Each select gate may have one or more transistors. Typically, the drain side select gate of a NAND string may be used to either connect the NAND string channel to the bit line or to cut off the NAND string channel from the bit line. Similarly, the source side select gate may be used to connect the NAND string channel to a source line or cut off the NAND string channel from the source line. Connecting the NAND string channel to the bit line is typically used to select a NAND string for a memory operation, such as program or read.

BRIEF DESCRIPTION OF THE DRAWINGS

Like-numbered elements refer to common components in the different figures.

FIG. 4A is a block diagram of one embodiment of a memory structure having two planes.

FIG. 4E depicts a cross sectional view of a portion of one embodiment of a block of memory cells.

DETAILED DESCRIPTION

Technology is described herein for a non-volatile storage system and method of operating the non-volatile storage system in which a voltage having a positive temperature coefficient (Tco) is applied to a control terminal of a dummy select transistor. A positive Tco means that the magnitude of the voltage has a positive dependence on temperature. Thus, a positive Tco means that the magnitude of the voltage will be smaller at lower temperatures and greater at higher temperatures. The dummy select transistor resides on a NAND string having non-volatile memory cells and a regular select transistor. The regular select transistor is used to either connect the NAND string channel to a bit line or source line or to cut off the NAND string channel from the bit line or the source line. The dummy select transistor is typically on (or conductive) during memory operations such as program and read. Therefore, the dummy select transistor is not used as a selection device. That is, the dummy select transistor is not used to select a NAND string. In some embodiments, the dummy select transistor is used to generate a gate induced drain leakage (GIDL) current during an erase operation. The GIDL current provides holes to erase the non-volatile memory cells. However, during program and read operations, the dummy select transistor should be strongly conductive such that the dummy select transistor does not have an effect on program or read operations.

In an embodiment, the positive Tco voltage is applied to the control terminal of a dummy select transistor during a program operation. Applying the positive Tco voltage during program operations reduces or eliminates program disturb to the dummy select transistor. Program disturb could potentially increase the threshold voltage (Vt) of the dummy select transistor, which makes it more difficult to keep the dummy select transistor conducting strongly during program and read operations. Therefore, applying the positive Tco voltage to the control terminal of a dummy select transistor during program operations helps to maintain the Vt of the dummy select transistors. Thus, the dummy select transistors do not negatively impact program or read operations.

In some embodiments, the memory structure has NAND strings together in what is referred to herein as a block. The block is sub-divided into sub-blocks that each contain a large number of NAND strings. Each sub-block may be selected by a different select line. Each select line connects to the control terminals of select transistors in the NAND strings. The select lines are separated by a dielectric material. To select one of the sub-blocks, a select voltage may be applied to the select line of that sub-block while applying an unselect voltage to the select lines of other sub-blocks.

Figure 1:
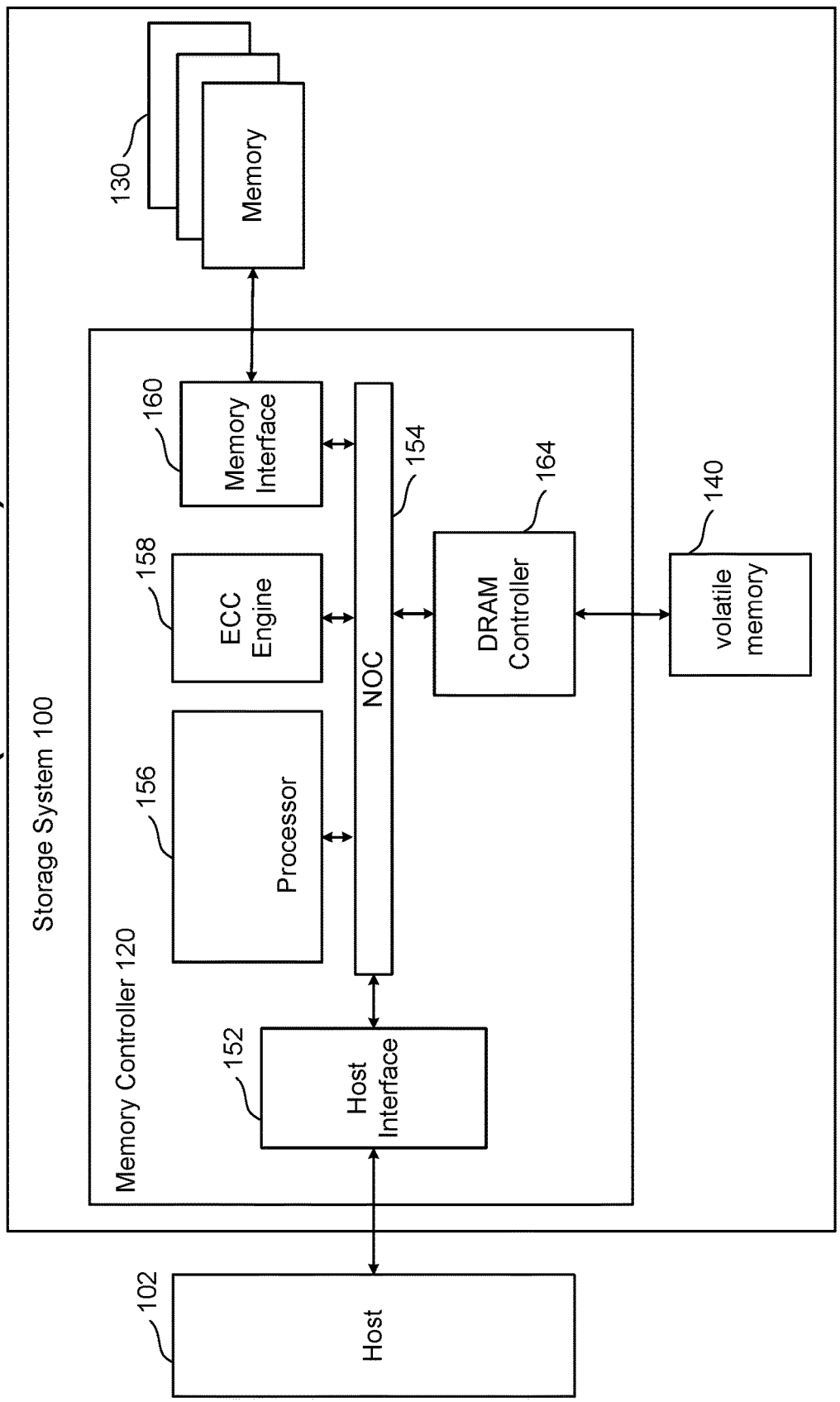
FIG. 1 is a block diagram depicting one embodiment of a storage system.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a non-volatile memory 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
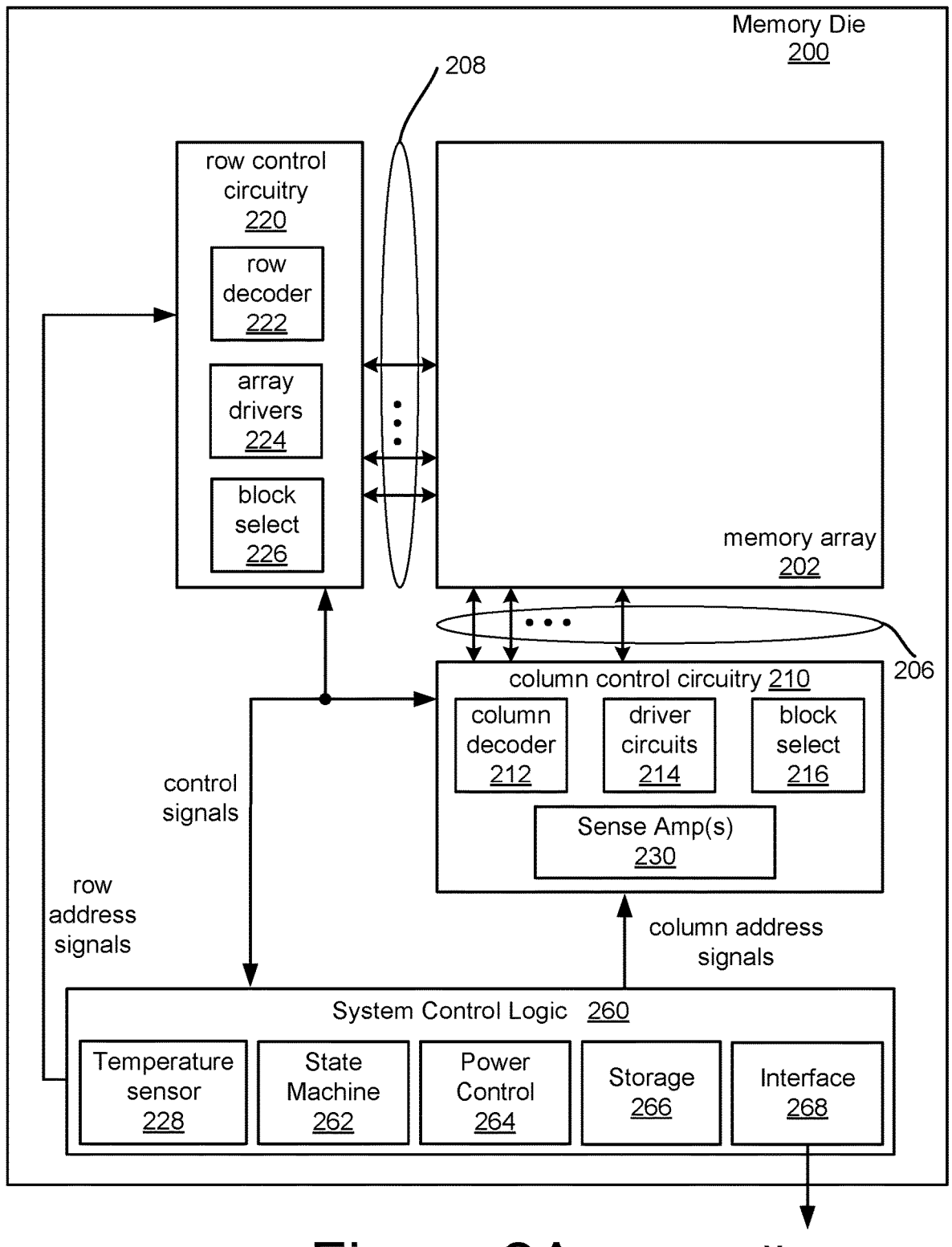
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 260, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a temperature sensor 228 that senses temperature. System control logic 260 can also include a power control module 264 that controls the power and voltages supplied to the rows and columns of the memory structure 202 during memory operations and may include charge pumps and regulator circuit for creating regulating voltages. In some embodiments, one or more of the voltages supplied to the rows and columns of the memory structure 202 during memory operations depend on the temperature. In one embodiment, one of the supplied voltages has a positive dependence on temperature, which is referred to herein as a positive temperature coefficient (Tco). A positive Tco means that the magnitude of the voltage will be smaller at lower temperatures and greater at higher temperatures. In one embodiment, the voltage provided during program operations to the control terminals of dummy select transistors on NAND strings has a positive Tco. In one embodiment, the voltage provided during program operations to the control terminals of GIDL current generating transistors (or GIDL transistors) on NAND strings has a positive Tco. In one embodiment, the voltage provided during program operations to the control terminals of depletion mode transistors on NAND strings has a positive Tco. The positive Tco voltage reduces or prevents hot carrier injection (HCI) disturb to the transistors. System control logic 260 includes storage 266 (e.g., RAM, registers, latches, etc.), which may be used to store parameters for operating the memory array 202. Those parameters may include voltage magnitudes for the power control to supply. In one embodiment, the parameters include one or more tables of voltage magnitude versus temperature. One embodiment includes a table of voltage magnitude versus temperature to supply to control terminals of dummy select transistors on NAND strings.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—

Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory structure die) and some or all of the peripheral circuitry elements, including one or more control circuits, can be formed on a separate die (referred to as the control die). For example, a memory structure die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory structure die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory structure die and one control die, other embodiments can use more die, such as two memory structure die and one control die, for example.

Figure 2B:
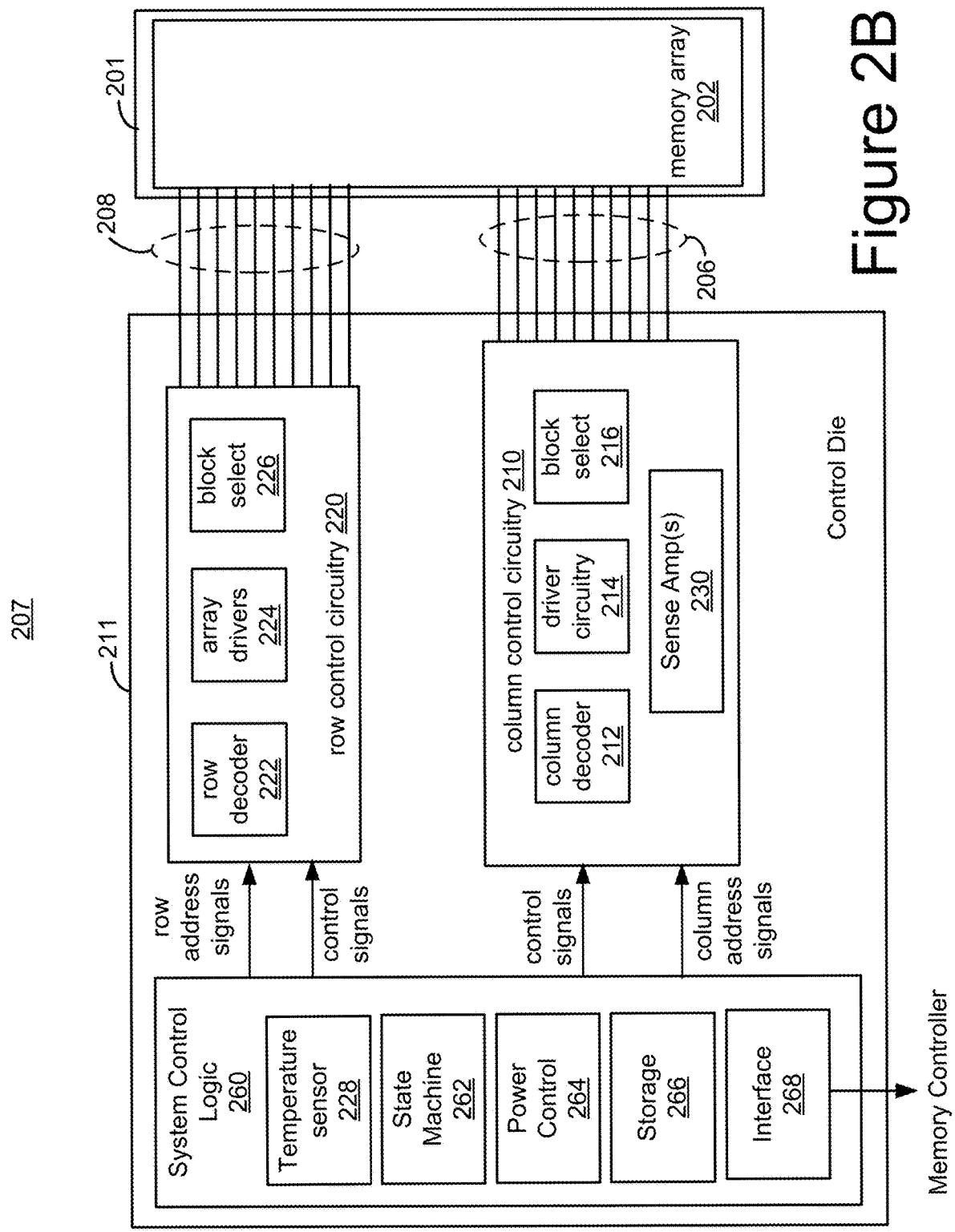
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, sense amps 230, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

Figure 3A:
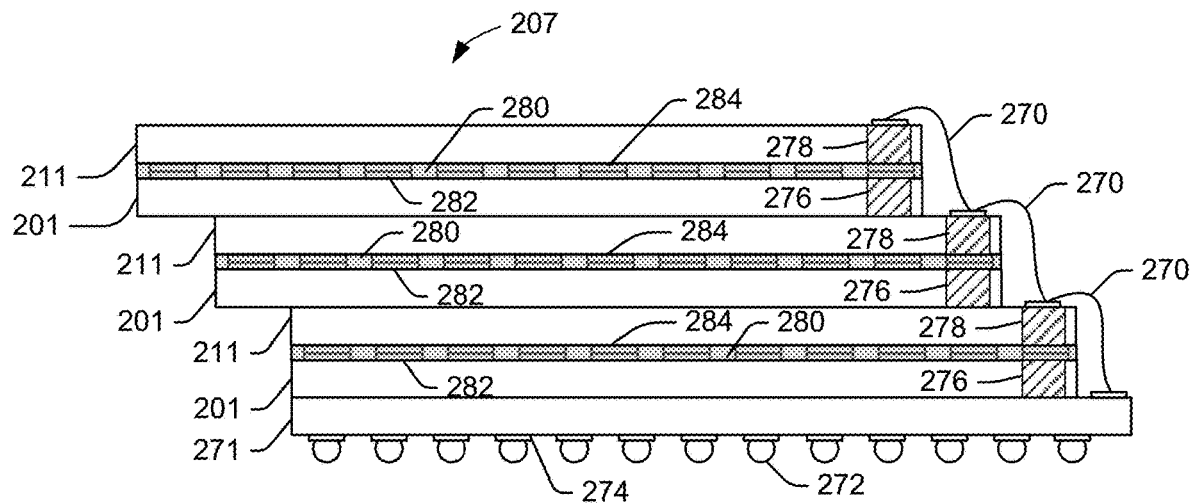
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control die 211 and multiple memory structure die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one memory structure die 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
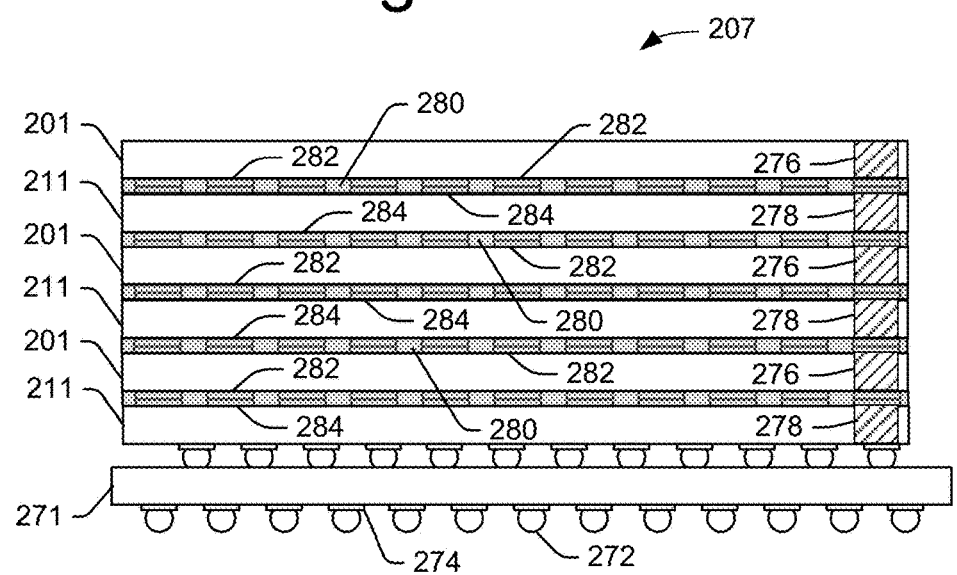

FIG. 3B depicts a side view of another embodiment of an integrated memory assembly 207 stacked on a substrate 271. The integrated memory assembly 207 of FIG. 3B has three control die 211 and three memory structure die 201. In some embodiments, there are many more than three memory structure die 201 and many more than three control die 211. In this example, each control die 211 is bonded to at least one memory structure die 201. Optionally, a control die 211 may be bonded to two or more memory structure die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
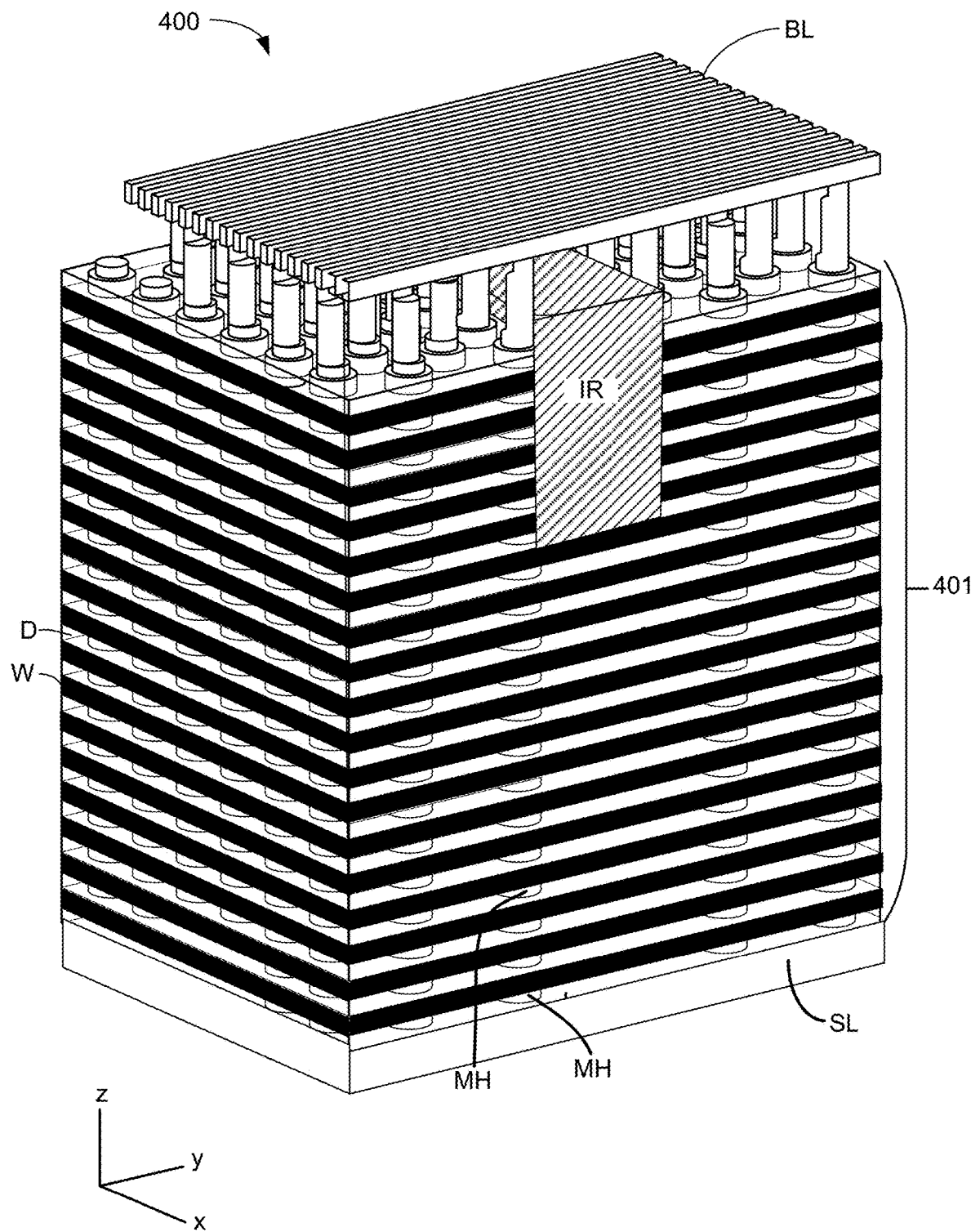
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 402/404, more or fewer than two planes can be implemented. In some embodiments, memory structure 202 includes eight planes.

Figure 4B:
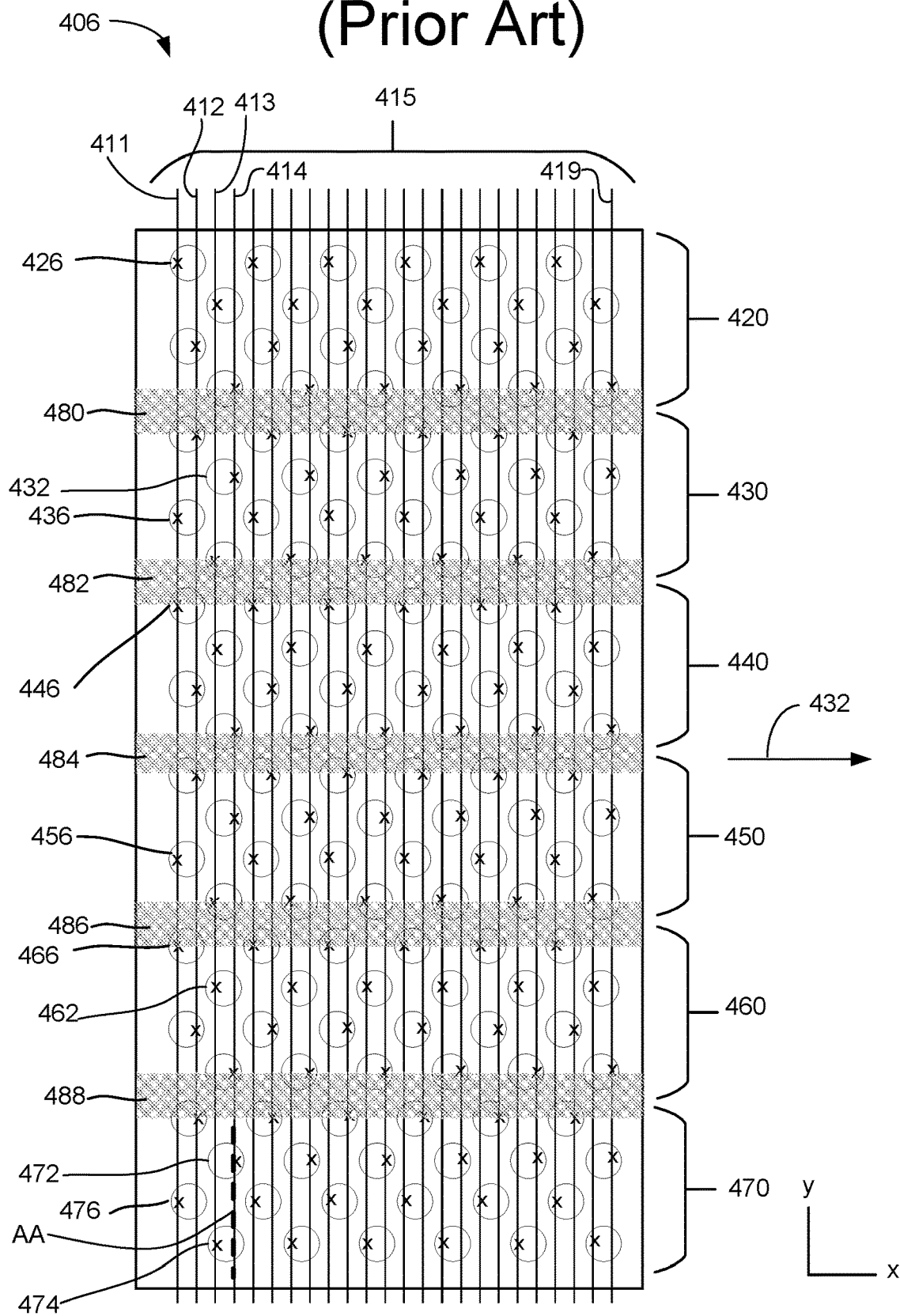
FIG. 4B depicts a top view of a portion of one embodiment of a block of memory cells.

FIGS. 4B-4H depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. Each of the vertical columns also includes one or more dummy select transistors. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or fewer regions per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

FIG. 4B shows that the isolation regions 480, 482, 484, 486, 488 each cut into a portion of some of the memory holes. For example, isolation region 482 cuts into a portion of memory hole 446. Recall that the isolation region only goes down as far as the SGD layer. Select transistors are formed in the SGD layer.

Figure 4C:
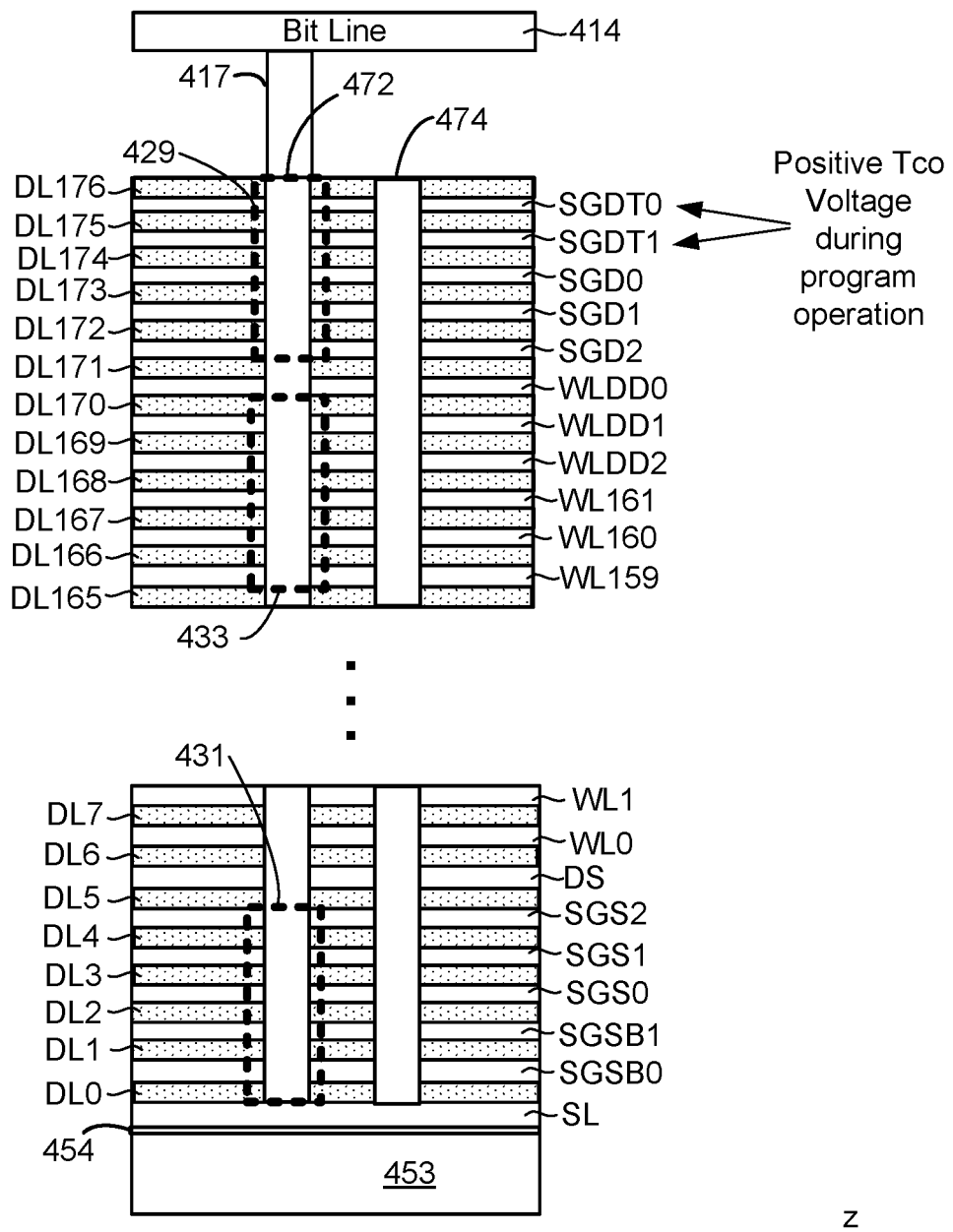
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes five drain side select gate layers (SGDT0, SGDT1, SGD0, SGD1 and SGD2). Select gate layers SGD0, SGD1 and SGD2 may be referred to as regular drain side select gate layers (the term "regular" may be dropped, such that SGD0, SGD1 and SGD2 may be more succinctly referred to as "drain side select gate layers"). Select gate layers SGDT0, SGDT1 may be referred to as dummy drain side select gate layers, or alternatively as top select gate layers. The structure of FIG. 4C also includes five source side select gate layers (SGSB0, SGSB1, SGS0, SGS1 and SGS2). Select gate layers SGS0, SGS1 and SGS2 may be referred to as regular source side select gate layers (or more succinctly as "source side select gate layers"). Select gate layers SGSB0, SGSB1 may be referred to as dummy source side select gate layers, or alternatively as bottom select gate layers. The structure of FIG. 4C also includes two dummy source side select layers SGSB0, SGSB1, three source side select layers SGS0, SGS1, and SGS2; three dummy word line layers DD0, DD1, and DDS; one hundred sixty two word line layers WL0-WL161 for connecting to data memory cells, and one hundred seventy seven dielectric layers DL0-DL176. Other embodiments can implement more or fewer than the numbers described above for FIG. 4C. In one embodiment, SGD0, SGD1 and SGD2 are electrically connected together; and SGDS0, SGS1 and SGS2 are electrically connected together. In one embodiment, SGDT0 and SGDT1 are electrically connected together; and SGSB0 and SGSB1 are electrically connected together. In one embodiment, the voltage applied to SGDT0 and SGDT1 during a program operation has a positive dependence on temperature (positive Tco). In one embodiment, the voltage applied to SGSB0 and SGSB1 during a program operation has a positive dependence on temperature (positive Tco).

Vertical columns 472 and 474 are depicted protruding through the dummy drain side select layers, drain side select layers, dummy source side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 472 has a source end at a bottom of the stack and a drain end at a top of the stack. As in agreement with FIG. 4B, FIG. 4C show vertical column 472 connected to bit line 414 via connector 417.

For ease of reference, dummy drain side select layers, drain side select layers; dummy source side select layers, source side select layers, dummy word line layers, and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL176. For example, dielectric layers DL166 is above word line layer WL159 and below word line layer WL160. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W161 connect to memory cells (also called data memory cells). Dummy word line layers DD0, DD1 and DS connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layers SGD0, SGD1, and SGD2 are used to electrically connect and disconnect (or cut off) the channels of respective NAND strings from bit lines. Source side select layers SGS0, SGS1, and SGS2 are used to electrically connect and disconnect (or cut off) the channels of respective NAND strings from the source line SL.

Figure 4D:
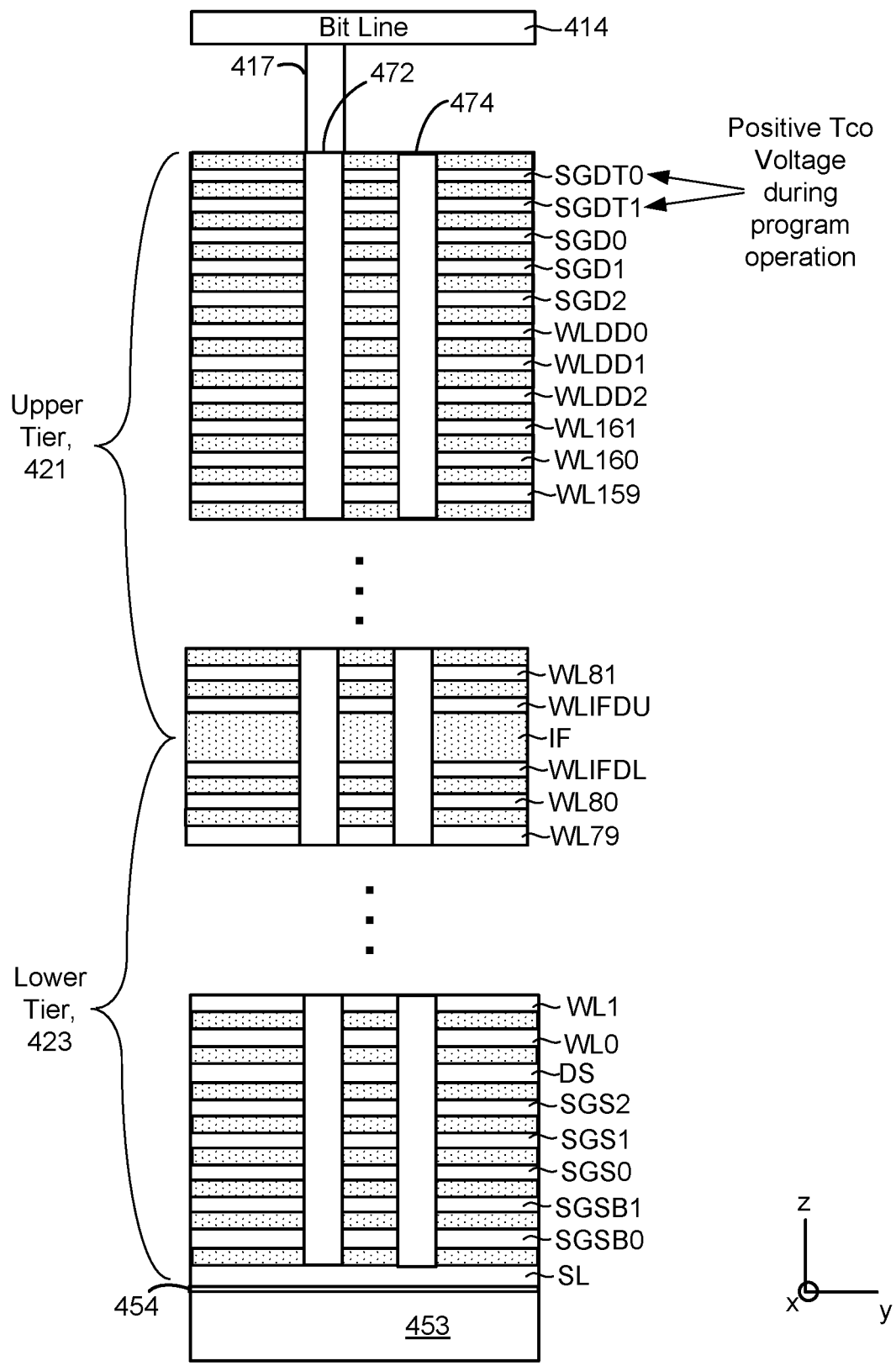
FIG. 4D depicts an example cross-sectional view of a portion of a sub-block, including NAND.

The stack in FIG. 4C is depicted as comprising one tier but can optionally include two or more tiers of alternating conductive and dielectric layers. FIG. 4D depicts an embodiment of a stack having two tiers. FIG. 4D depicts an example cross-sectional view of a portion of a sub-block, including NAND strings 472 and 474 of region 470 (see FIG. 4B), in a two-tier stack comprising an upper tier 421 and a lower tier 423. A two-tier other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the upper tier 421 and the lower tier 423 are erased independent of one another. Hence, data may be maintained in the lower tier 423 after the upper tier 421 is erased. Likewise, data may be maintained in the upper tier 421 after the lower tier 423 is erased FIG. 4E depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO (silicon oxide, silicon nitride, silicon oxide) structure. Surrounding tunneling dielectric 492 is charge trapping layer 493, such as (for example) Silicon Nitride. Other memory materials and structures can also be used. The technology described herein is not limited to any particular material or structure.

FIG. 4E depicts dielectric layers DL172-DL176, as well dummy drain side select layers SGDT0, SGDT1 and drain side select layers SGD0, SGD1 and SGD2. Each of layers SGDT0, SGDT1, SGD0, SGD1 and SGD2 includes a tungsten region 496 surrounded by an aluminum oxide layer 497, which is surrounded by a blocking oxide layer 498. In other embodiments, the blocking oxide layer can be a vertical layer parallel and adjacent to charge trapping layer 493. In other embodiments, a conductor other than tungsten can be used in region 496. The physical interaction of the tungsten region 496 with the vertical column forms the dummy drain side select transistors and the drain side select transistors. Thus, each of these transistors, in one embodiment, comprises channel 491, tunneling dielectric 492, charge trapping layer 493, blocking oxide layer 498, aluminum oxide layer 497 and tungsten region 496. For example, SGDT0 and a portion of vertical column 472 comprise a dummy drain select transistor DDST0; SGDT1 and a portion of vertical column 472 comprise a dummy drain select transistor DDST1; SGD0 and a portion of vertical column 472 comprise a drain select transistor DST0; SGD1 and a portion of vertical column 472 comprise a drain select transistor DST1; and SGD2 and a portion of vertical column 472 comprise a drain select transistor DST2. In other architectures, the dummy drain side select transistors and the drain side select transistors may have a different structure.

In an embodiment, transistors DDST0 and DDST1 are used to generate GIDL current during a GIDL erase operation. In a GIDL erase operation, a GIDL current is used to charge up the NAND string channel. An erase enable voltage is applied to control terminals of the memory cells, while applying an erase voltage to the bit line. In an embodiment of a one sided GIDL erase, transistors DDST0 and DDST1 are used to generate a GIDL current while an erase voltage is applied to the bit line.

In one embodiment, the GIDL current is generated by causing a drain-to-gate voltage at a dummy select transistor (e.g., SGDT0, SGDT1). A transistor drain-to-gate voltage that generates a GIDL current is referred to herein as a GIDL voltage. The GIDL current may result when the dummy select transistor drain voltage is significantly higher than the dummy select transistor control terminal voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

In some embodiments, transistors DDST0 and DDST1 are depletion mode transistors. In some embodiments, transistors DDST0 and DDST1 are n-type depletion mode transistors. In an embodiment, the channel 491 of transistors DDST0 and DDST1 is doped with an n-type dopant. For example, the channel 491 of transistors DDST0 and DDST1 may be doped with phosphorous. In some embodiments, transistors DST0, DST1, and DST2 are enhancement mode transistors. In some embodiments, the voltage applied to the control terminals of transistors DDST0 and DDST1 during a program operation has a positive dependence on temperature (positive Tco).

Figure 4F:
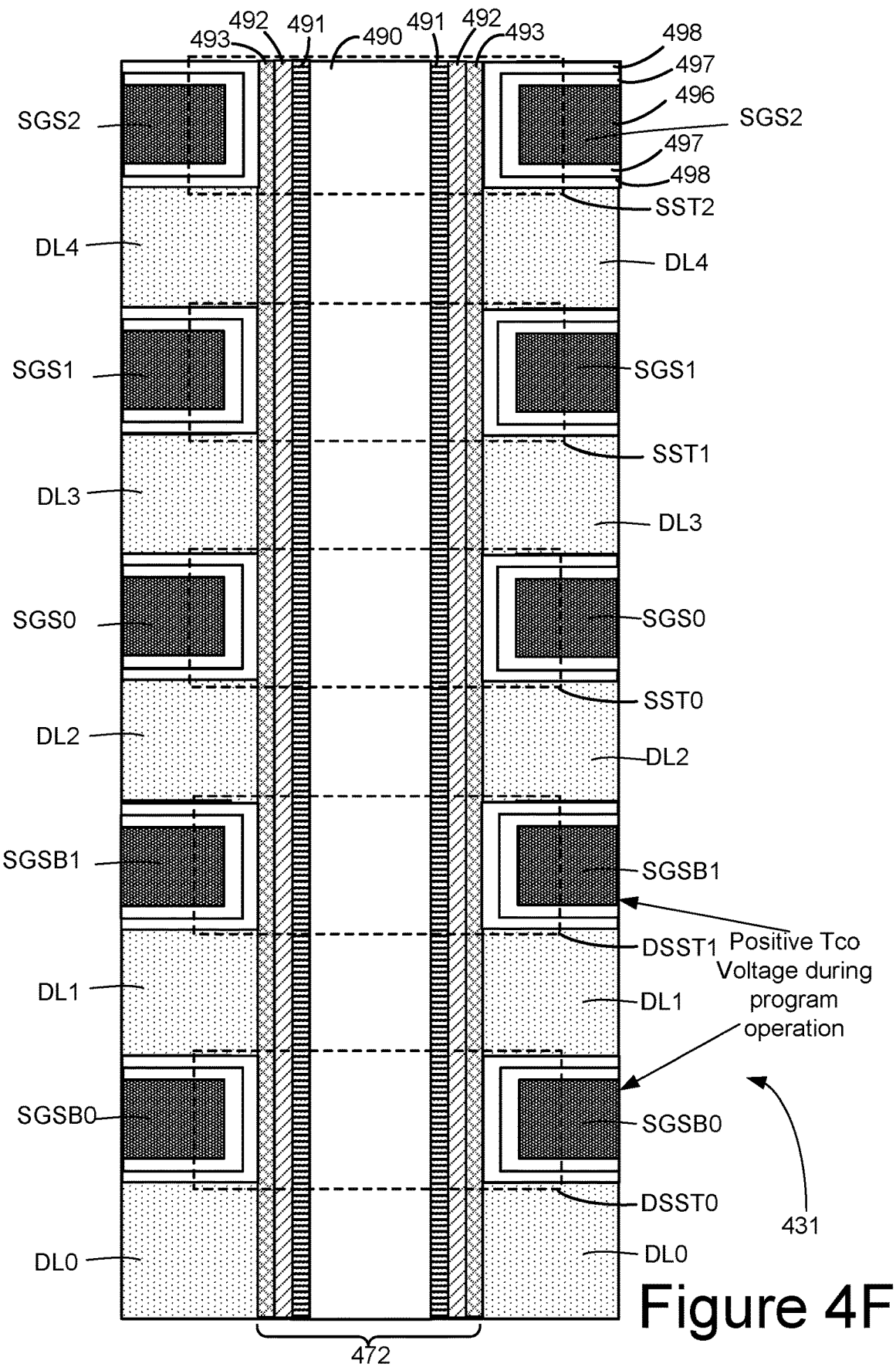
FIG. 4F depicts a cross sectional view of a portion of one embodiment of a block of memory cells.

FIG. 4F depicts a cross sectional view of region 431 of FIG. 4C that includes a portion of vertical column 472. The inner core layer 490, polysilicon channel 491, tunneling dielectric 492, charge trapping layer 493 are depicted. These layers have been described in connection with FIG. 4E.

FIG. 4F depicts dielectric layers DL0-DL4, as well as dummy source side select layers SGSB0, SGSB1 and source side select layers SGS0, SGS1 and SGS2. Each of layers SGSB0, SGSB1, SGS0, SGS1 and SGS2 includes a tungsten region 496 surrounded by an aluminum oxide layer 497, which is surrounded by a blocking oxide layer 498. The physical interaction of the tungsten region 496 with the vertical column forms the dummy source side select transistors and the source side select transistors. Thus, each of these transistors, in one embodiment, comprises channel 491, tunneling dielectric 492, charge trapping layer 493, blocking oxide layer 498, aluminum oxide layer 497 and tungsten region 496. For example, SGSB0 and a portion of vertical column 472 comprise a dummy source select transistor DSST0; SGSB1 and a portion of vertical column 472 comprise a dummy source select transistor DSST1; SGS0 and a portion of vertical column 472 comprise a source select transistor SST0; SGS1 and a portion of vertical column 472 comprise a source select transistor SST1; and SGS2 and a portion of vertical column 472 comprise a source select transistor SST2. In other architectures, the dummy source side select transistors and the source side select transistors may have a different structure.

In an embodiment, transistors SGSB0 and SGSB1 are used to generate GIDL current during a GIDL erase operation. In an embodiment of a one sided GIDL erase, transistors SGSB0 and SGSB1 are used to generate a GIDL current while an erase voltage is applied to the source line. In an embodiment of a two sided GIDL erase, transistors SGSB0 and SGSB1 are used to generate a GIDL current while an erase voltage is applied to the source line; and transistors SGDT0 and SGDT1 (see FIG. 4E) are used to generate a GIDL current while an erase voltage is applied to the bit line.

In some embodiments, transistors SGSB0 and SGSB1 are depletion mode transistors. In some embodiments, transistors SGSB0 and SGSB1 are n-type depletion mode transistors. In an embodiment, the channel 491 of transistors SGSB0 and SGSB1 is doped with an n-type dopant. For example, the channel 491 of transistors SGSB0 and SGSB1 may be doped with phosphorous. In some embodiments, transistors SST0, SST1, and SST2 are enhancement mode transistors. In some embodiments, the voltage applied to the control terminals of transistors DSST0 and DSST1 during a program operation has a positive dependence on temperature (positive Tco).

Figure 4G:
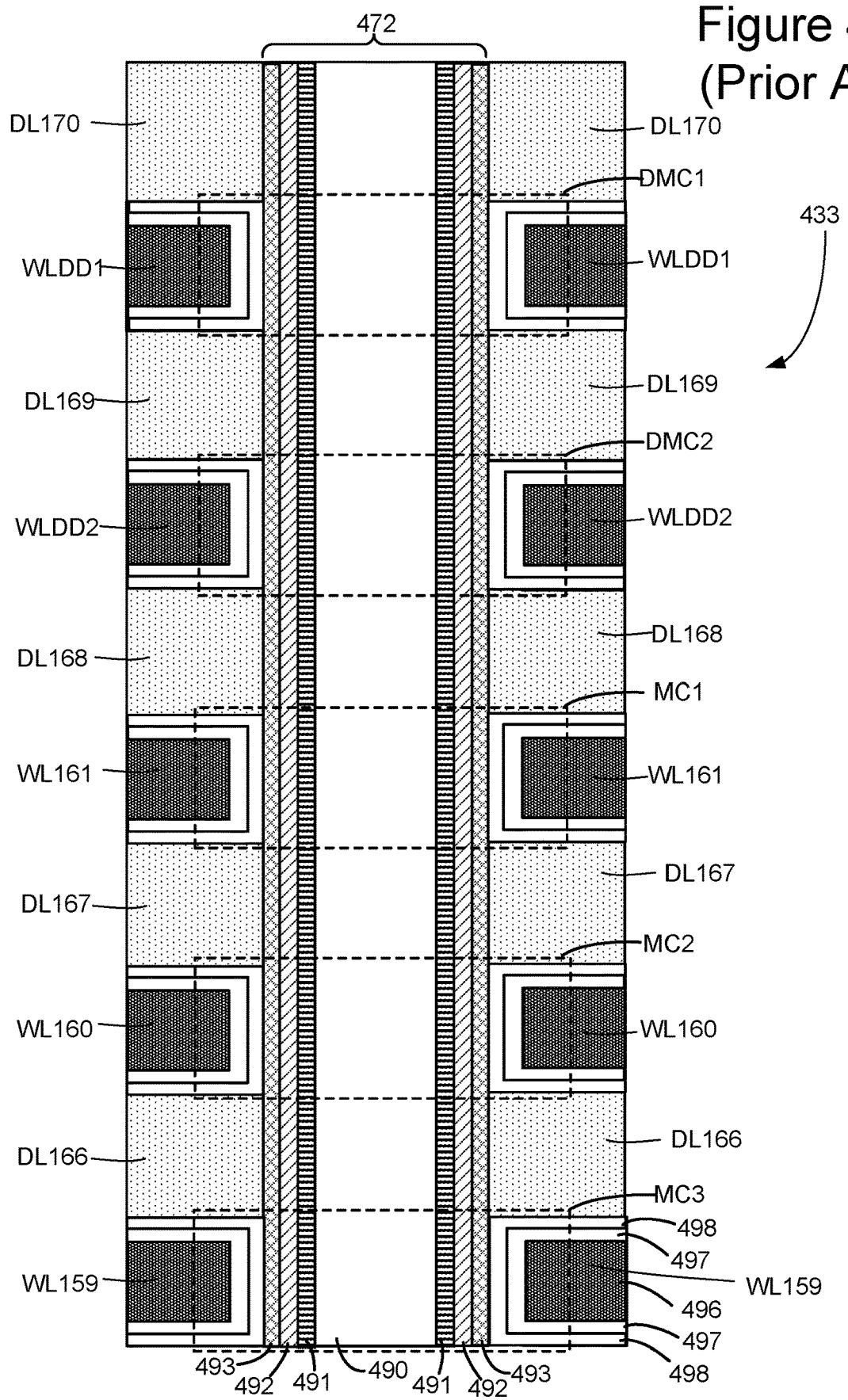
FIG. 4G is a cross sectional view of one embodiment of a vertical column of memory cells.

FIG. 4G depicts a cross sectional view of region 433 of FIG. 4C that includes a portion of vertical column 472. FIG. 4G depicts dielectric layers DL166-DL170, word line layers WL159, WL160, WL161, as well as dummy word line layers WLDD2, WLDD1. Each of the dummy word line layers and the word line layers includes tungsten region 496 surrounded by an aluminum oxide layer 497, which is surrounded by a blocking oxide layer 498. The physical interaction of the word line layers with the vertical column forms the memory cells. A conductor other than tungsten may be used for region 496. The physical interaction of the dummy word line layers with the vertical column forms the dummy memory cells. Thus, a memory cell, in one embodiment, comprises channel 491, tunneling dielectric 492, charge trapping layer 493, blocking oxide layer 498, aluminum oxide layer 497 and tungsten region 496. For example, word line layer WLL159 and a portion of vertical column 472 comprise a memory cell MC3; word line layer WLL160 and a portion of vertical column 472 comprise a memory cell MC2; word line layer WLL161 and a portion of vertical column 472 comprise a memory cell MC1; dummy word line layer WLLDD2 and a portion of vertical column 472 comprise a dummy memory cell MC2; and dummy word line layer WLLDD1 and a portion of vertical column 472 comprise a dummy memory cell MC1. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on tungsten region 496. The threshold voltage (Vt) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as Gate Induced Drain Leakage (GIDL).

Figure 4H:
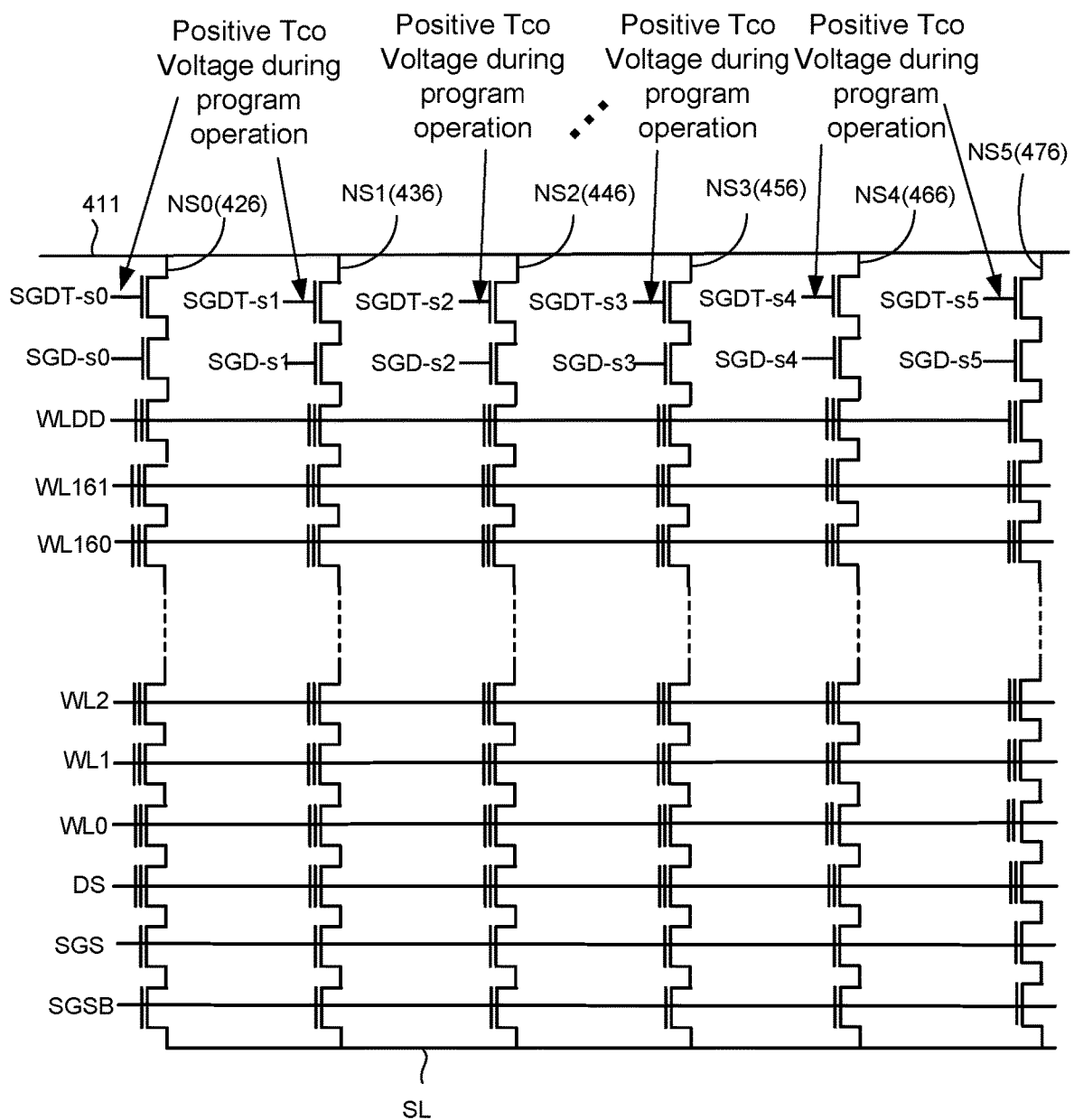
FIG. 4H is a schematic of a plurality of NAND strings in multiple sub-blocks of a same block.

FIG. 4H is a schematic diagram of a portion of the memory array 202 depicted in in FIGS. 4-4G. FIG. 4H shows physical data word lines WL0-WL161 running across the entire block. The structure of FIG. 4H corresponds to a portion 406 in Block 2 of FIG. 4A, including bit line 411. Within the block, in one embodiment, each bit line is connected to six NAND strings. Thus, FIG. 4H shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4H as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

In one embodiment, SGDT0 and SGDT1 are connected together to operate as a single logical dummy select gate for each sub-block separated by isolation regions (480, 482, 484, 486 and 486) to form SGDT-s0, SGDT-s1, SGDT-s2, SGDT-s3, SGDT-s4, and SGDT-s5. SGSB0 and SGSB1 are also connected together to operate as a single logical dummy select gate that is represented in FIG. 4H as SGSB.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4H only shows the NAND strings connected to bit line 411. However, a full schematic of the block would show every bit line and six vertical NAND strings connected to each bit line.

Although the example memories of FIGS. 4-4H are three dimensional memory structure that includes vertical NAND strings with charge-trapping material, other (2D and 3D) memory structures can also be used with the technology described herein.

Figure 5A:
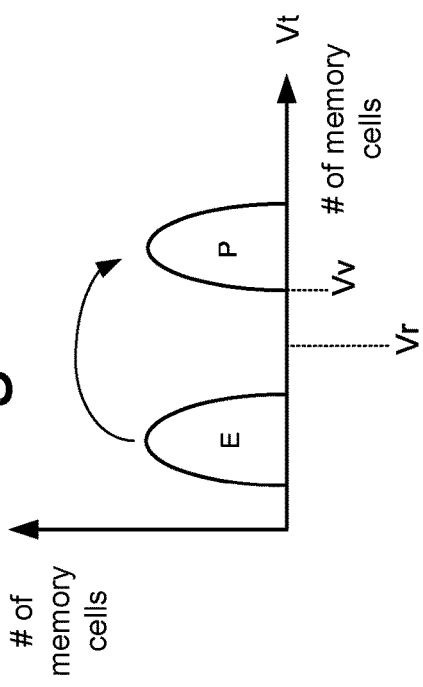
FIGS. 5A and 5B depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores three bits of data. Other embodiments may use other data capacities per memory cell (e.g., such as two, four, or five bits of data per memory cell).

Figure 5B:
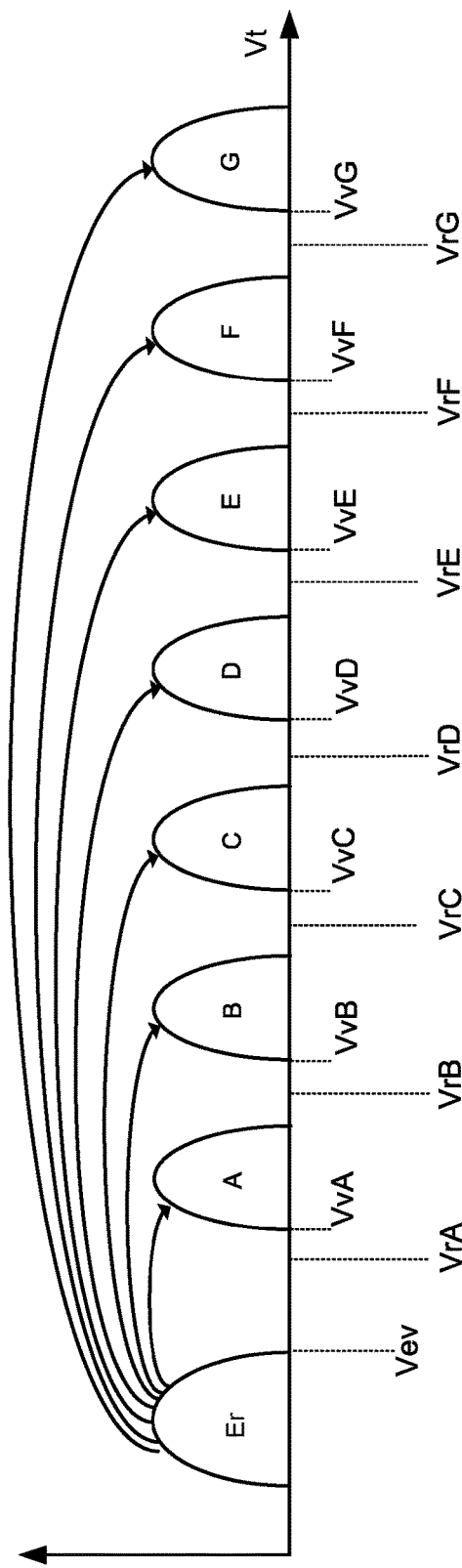

FIG. 5B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 5B also shows a number of verify reference voltages. The verify high voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5B represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

Figure 6:
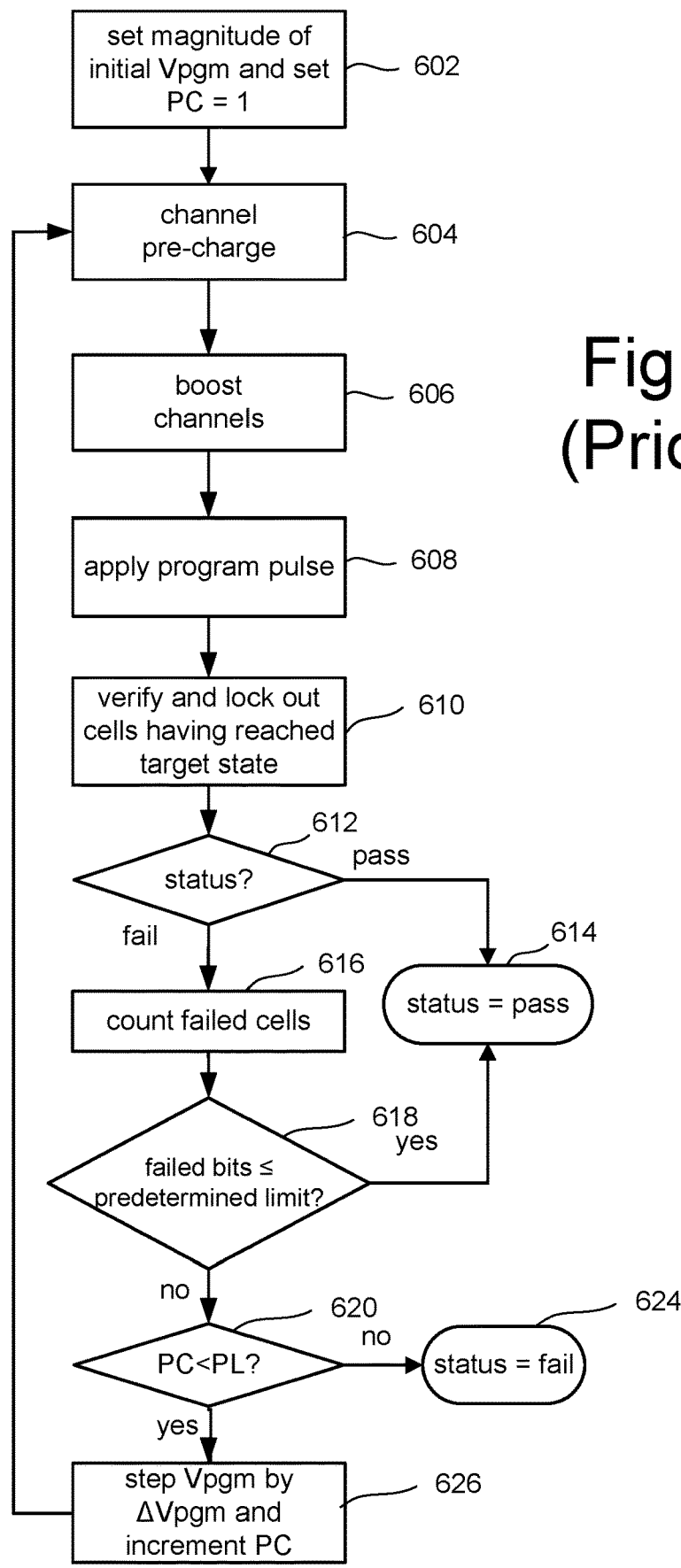
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 6 is performed to implement the full sequence programming, as well as other programming schemes including multi-stage programming. When implementing multi-stage programming, the process of FIG. 6 is used to implement any/each stage of the multi-stage programming process.

Typically, the program voltage applied to the control terminals (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In some embodiments, the voltage applied to dummy select gates during steps 604, 606, and 608 has a positive Tco. In one embodiment, the voltage applied to dummy drain side select gates during steps 604, 606, and 608 has a positive Tco. In one embodiment, the voltage applied to dummy source side select gates during steps 604, 606, and 608 has a positive Tco. In one embodiment, the voltage applied to both dummy drain side select gates and dummy drain source select gates during steps 604, 606, and 608 has a positive Tco.

In step 610, program verify is performed and memory cells that have reached their target states are locked out from further programming by the control die. Step 610 may also include determining whether a memory cell should receive slow programming during the next program loop, as opposed to full programming. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify high voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, or from states A-G to state Er of FIG. 5B.

One technique to erase memory cells in some memory devices is to bias a p-well (or other types of) substrate to a high voltage to charge up a NAND channel. An erase enable voltage (e.g., a low voltage) is applied to control terminals of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control terminals of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a dummy select transistor (e.g., SGDT and/or SGSB). A transistor drain-to-gate voltage that generates a GIDL current is referred to herein as a GIDL voltage. The GIDL current may result when the dummy select transistor drain voltage is significantly higher than the dummy select transistor control terminal voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a dummy select transistor (e.g., dummy drain side select transistor) that is connected to or near a bit line to generate a first GIDL current. A second GIDL voltage may be created between two terminals of a dummy select transistor (e.g., dummy source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
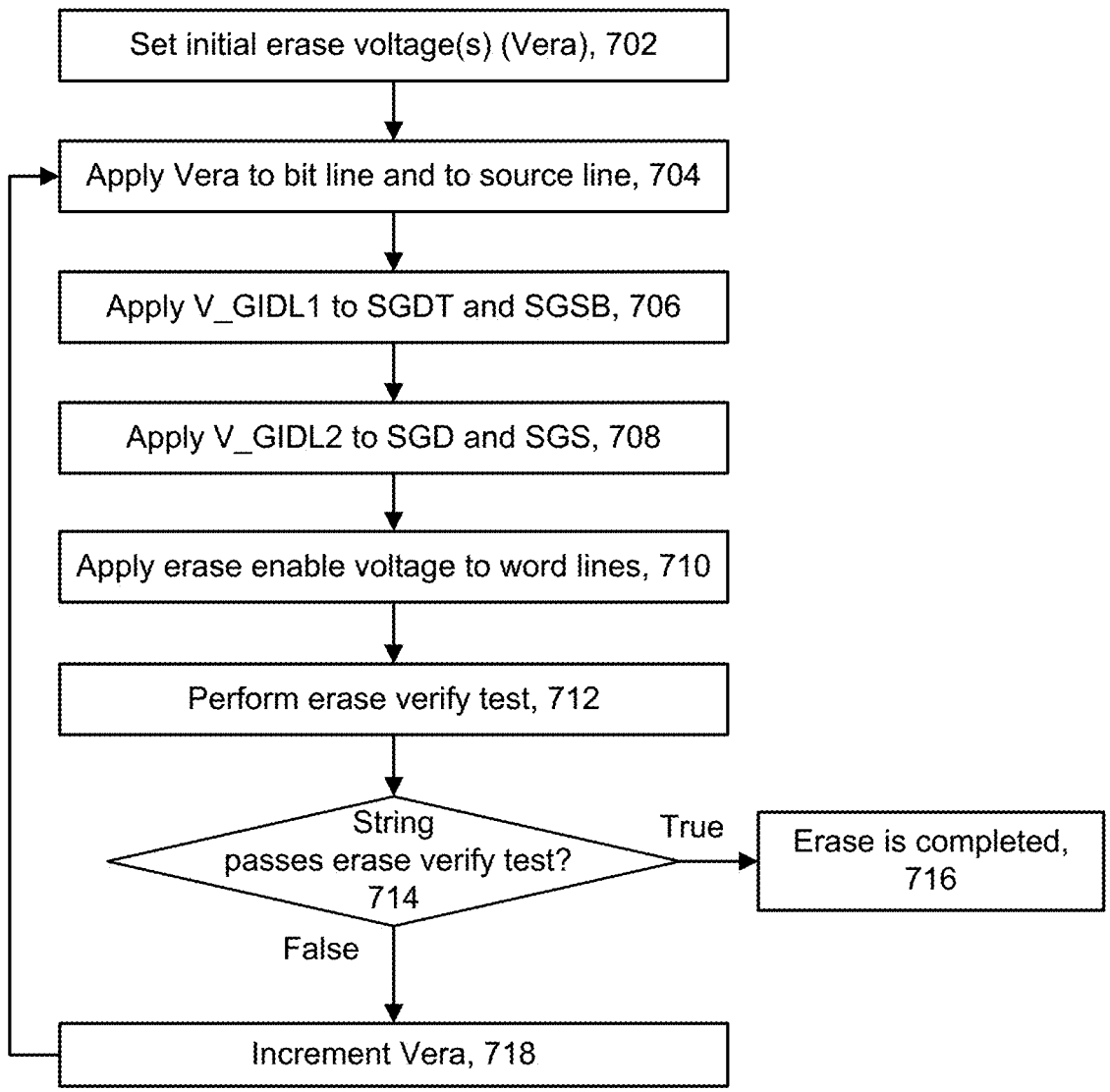
FIG. 7 depicts one embodiment of a process for performing an erase operation.

FIG. 7 depicts one embodiment of a process for performing an erase operation. The process 700 is described with respect to a NAND string of memory cells. The NAND string includes a dummy select gate at each end of the NAND string. For example, a first dummy select gate may be a dummy drain side select gate, which is adjacent to a bit line. A second dummy select gate may be a dummy source side select gate, which is adjacent to a source line. The process may be performed in parallel on many NAND strings. The process may be used to erase a NAND string such as depicted in FIGS. 4A-4H.

Step 702 sets a magnitude of an initial erase voltage (Vera). An example initial Vera is 18V. In process 700, a two-sided GIDL erase is performed in which the erase voltage will be applied to the bit line and to the source line. In another embodiment, a one-sided GIDL erase from the drain end of the NAND string is performed. In another embodiment, a one-sided GIDL erase from the source end of the NAND string is performed.

Step 704 includes applying Vera to the bit line and to the source line that are associated with the NAND string to be erased. In one embodiment, a block of NAND strings are erased as a unit. Thus, process 700 may be performed in parallel on a block of NAND strings. If a one-sided GIDL erase from the drain end of the NAND string is to be performed, then Vera is applied to the bit line but not the source line. If a one-sided GIDL erase from the source end of the NAND string is to be performed then Vera is applied to the source line but not the bit line.

Step 706 includes applying V_GIDL1 to SGDT and to SGSB. Thus, V_GIDL1 is applied to the control terminal of the dummy select transistor(s) at both ends of the NAND string. The combination of V_GIDL1 applied to the control terminal and Vera applied to the bit line or source line will cause the respective dummy select transistors to generate a GIDL current. In an embodiment, V_GIDL1 is about 0V. However, V_GIDL1 could be larger. The dummy select transistor(s) allow for a very large voltage difference between the gate (i.e., control terminal) and drain of the dummy select transistor. Therefore, a large GIDL current may be generated.

Step 708 includes applying V_GIDL2 to SGD and SGS. In an embodiment, V_GIDL2 is about 6V to 12V less than Vera.

Step 710 includes applying an erase enable voltage to the data word lines connected to the NAND string being erased. A voltage is also applied to the dummy word lines. In some embodiments, the dummy word lines receive a higher voltage than the data word lines. In an embodiment, the data word lines receive about 0.5V, and the dummy word lines receive about 4V. As a result of steps 704-710, the channel of the NAND string is charged up from both the source end and the drain end. Holes provided by the GIDL current remove electrons from the charge trapping regions of the memory cells to erase the memory cells.

Step 712 includes performing an erase verify test for the NAND string. Typically, this involves setting an erase verify voltage VvEr to the word lines that are connected to control terminals of memory cells on the NAND string while sensing a current in the NAND string. If the current is sufficiently high, the NAND string is considered to pass the verify test. If the NAND string passes the erase verify test at decision step 714, the erase operation is completed for the NAND string, at step 716. If the NAND string does not pass the erase verify test at decision step 714, the process continues at step 718. The erase voltage is incremented in step 718. Then, the next iteration of the erase procedure is performed by returning to step 704. An erase iteration (or loop) typically involves applying erase conditions followed by performing a verify test, although in some cases the verify test is omitted.

It is possible for a dummy select gate to suffer program disturb, which will unintentionally change the threshold voltage of the dummy select gate. For example, the threshold voltage could be unintentionally increased. This higher Vt can impede proper operation of the dummy select gate. As noted above, the dummy select gates are not used as selection devices. That is, the dummy select gates are not used to select NAND strings. In some embodiments, the dummy select gates should be strongly on (i.e., highly conductive) during program and read operations, which effectively makes them transparent to the program or read operation. However, increasing the Vt of the dummy select gate may reduce the conductivity for a given control terminal voltage. The program disturb may be temperature dependent. For example, the program disturb may be worse at lower temperature.

Figure 8A:
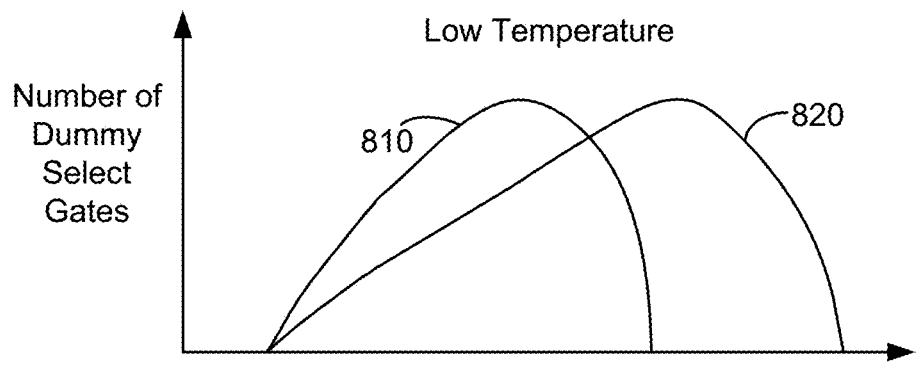
FIGS. 8A, 8B, and 8C each show possible Vt distributions for dummy select gates for which a positive Tco voltage is not used during program, such that some amount of program disturb has occurred.
Figure 8B:
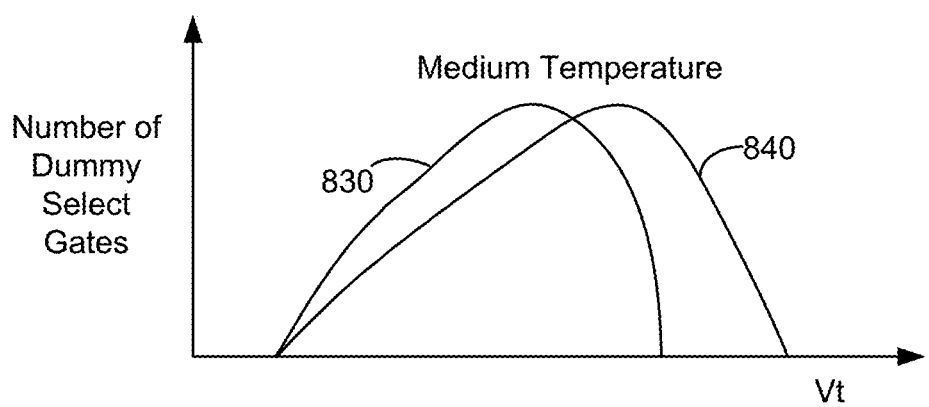
Figure 8C:
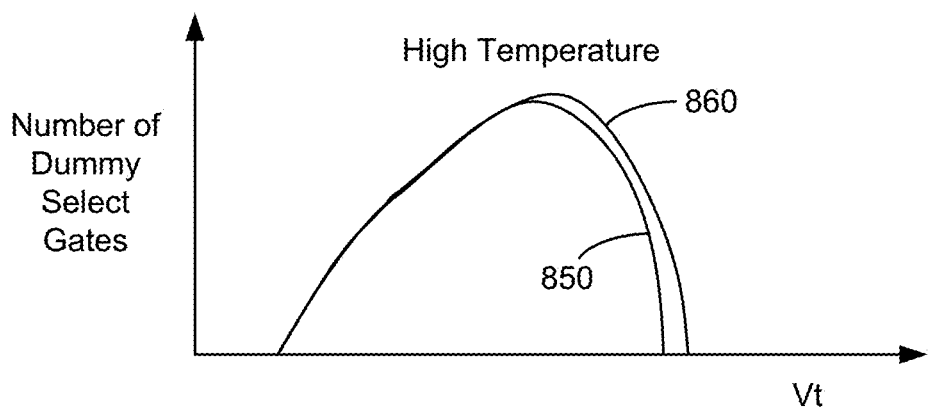

FIGS. 8A, 8B, and 8C each show possible Vt distributions for dummy select gates for which a positive Tco voltage is not used during program, such that some amount of program disturb has occurred. Each diagram has a Vt distribution for fresh dummy select gates (no program erase/cycles), as well as a Vt distribution after a number of program erase/cycles in which a positive Tco voltage is not used during program. As an example, the cycled case may be for a few thousand program erase/cycles. Each program erase/cycle refers to the erase of a group of NAND strings (or portion of NAND string in the case of upper tier/lower tier erase) containing the dummy select gates, followed by programming the memory cells on the NAND strings. The three diagrams are for three different temperatures of operation. FIG. 8A shows Vt distributions for low operational temperature. FIG. 8B shows Vt distributions for medium operational temperature. FIG. 8C shows Vt distributions for high operational temperature. An example operating temperature range is between −40 degrees Celsius to 100 degrees Celsius, which could be divided roughly equally between low-, medium-, and high-temperature operation.

Referring to the low temperature case in FIG. 8A, Vt distribution 810 is for fresh dummy select gates and Vt distribution 820 is for cycled dummy select gates. Referring to the medium temperature case in FIG. 8B, Vt distribution 830 is for fresh dummy select gates and Vt distribution 840 is for cycled dummy select gates. Referring to the high temperature case in FIG. 8C, Vt distribution 850 is for fresh dummy select gates and Vt distribution 860 is for cycled dummy select gates.

Referring again to the low temperature case in FIG. 8A, a comparison of the two Vt distribution 810, 820 indicates considerable program disturb. That is, threshold voltages of the dummy select gates increased considerably over the p/e cycles. Referring again to the medium temperature case in FIG. 8B, a comparison of the two Vt distribution 830, 840 indicates some program disturb, but the shift in Vt distribution 840 is not as severe as the shift in Vt distribution 820 shown in the low temperature case in FIG. 8A. Referring again to the high temperature case in FIG. 8C, a comparison of the two Vt distribution 850, 860 indicates relatively little program disturb. Therefore, the Vt distributions in FIGS. 8A-8C show a temperature dependence on the program disturb to the dummy select gates.

An embodiment of a control circuit applies a positive Tco voltage to control terminals of dummy select gate during program operations, which can prevent or reduce program disturb to the dummy select gate. For example, applying a lower voltage to control terminals of dummy select gate during low temperature operations can prevent or reduce the severe program disturb case depicted in Vt distribution 820 in FIG. 8A. Applying a medium voltage to control terminals of dummy select gate during medium temperature operations may be sufficient to prevent or reduce the medium program disturb case depicted in Vt distribution 840 in FIG. 8A. Since the amount of program disturb at higher temperatures is not as severe (see Vt distribution 860), a higher voltage may be applied to control terminals of dummy select gate during high temperature operations.

Figure 9:
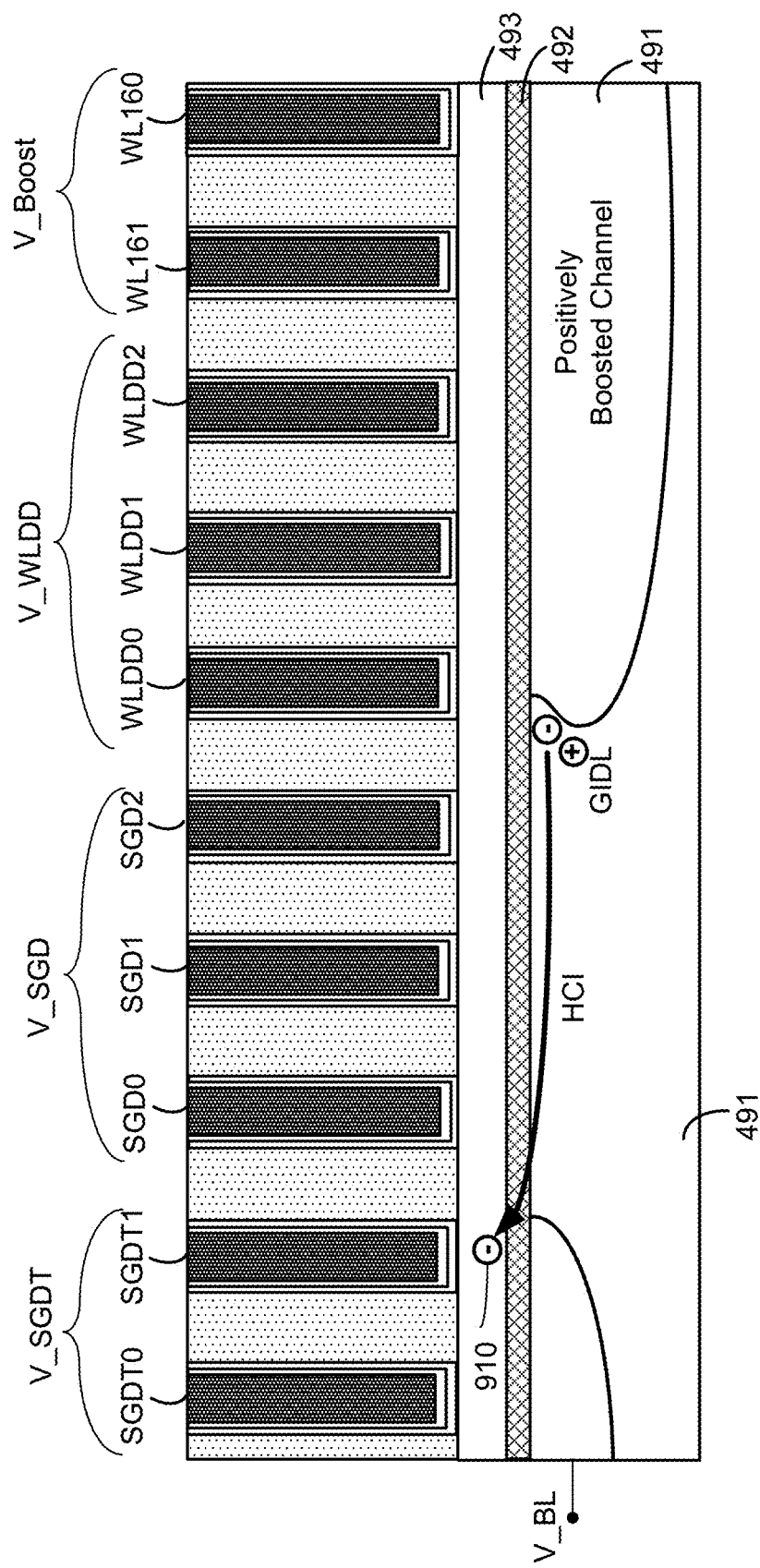
FIG. 9 is diagram of a portion of a NAND string, showing conditions during a program operation.

FIG. 9 is diagram of a portion of a NAND string, showing conditions during a program operation. FIG. 9 will be referred to in order to discuss a possible physical phenomenon for the program disturb to the dummy select gates. However, other physical phenomena may also impact the program disturb to the dummy select gates. The NAND string in FIG. 9 is consistent with the examples depicted in FIGS. 4C, 4D, and 4E. The portion of the NAND string that is depicted in FIG. 9 has two dummy drain side select transistors, three drain side select transistors, three dummy memory cells, and two memory cells. The following will describe an example in which the NAND string is an unselected NAND string during a program operation. During a program operation, a program voltage is applied to a selected word line (the selected word line is not depicted in FIG. 9). Therefore, there will be a memory cell on the unselected NAND string that will have the program voltage applied to its control terminal. However, this memory cell is to be inhibited from programming. Hence, voltage are applied to the unselected NAND string to inhibit programming of this memory cell.

A voltage V_SGDT is applied to the control terminals (SGDT0, SGDT1) of the dummy drain side select transistors. A voltage V_SGD is applied to the control terminals of the select gates (SGD0, SGD1, SGD2) of the drain side select transistors. A voltage V_WLDD is applied to the control terminals (WLDD0, WLDD1, WLDD2) of the dummy memory cells. A voltage V_Boost is applied to the control terminals (WL161, WL160) of the memory cells. WL161 and WL160 are unselected word lines. The control terminals may also be referred to as the gate of the transistor. The voltage V_Boost is applied to other unselected word lines, which are not depicted in FIG. 9. A program voltage is applied to the selected word line (not depicted in FIG. 9). A voltage V_BL is applied to the bit line that connects to the channel 491 of the NAND string. Example voltages are 2.2V for V_BL, 6.4V for V_SGDT, 2.5V for V_SGD, between 4.2V to 6.2V for V_WLDD, and 8.5V for V_Boost. Note that V_SGDT needs to be high enough to keep the dummy select transistors on (conducting). However, a higher magnitude V_SGDT can possibly lead to greater program disturb to the dummy select transistor.

The combination of V_BL applied to the bit line and V_SGD applied to SGD0, SGD1, and SGD2 will cut off the channel 491 from the bit line for this unselected NAND string. Therefore, the channel 491 will float. The voltage V_Boost applied to the unselected word line (as well as V_WLDD applied to dummy word lines) will raise the potential of the floating channel 491. The channel potential is raised due to capacitive coupling between the word lines and the floating channel 491. Raising the channel potential therefore reduces the electrical field across the memory cell connected to the selected word line, which inhibits programming of that memory cell. However, FIG. 9 shows a GIDL effect in the channel 491 at about the location between WLDD0 and SGD2. Hence, there may be electron/hole pairs generated in the channel 491. Some of these electrons may be injected into the charge trap region 493 of a dummy select transistor by, for example, hot carrier injection (HCI). FIG. 9 shows an electron 910 that has been injected in the charge trap region 493 below SGDT1. The injection of such electrons raises the Vt of the dummy select transistor.

The HCI phenomena may be temperature dependent. The HCI phenomena may be worse at lower temperature. Therefore, program disturb to the dummy select transistor may be worse at lower temperatures. Note that there is not an easy solution to adjust the voltages to the bit line, select gates, dummy word lines, and/or unselected word lines to mitigate the program disturb to the dummy select gate. The voltages to the dummy word lines and the unselected word lines need to be relatively high to boost the channel 491 sufficient to inhibit programming of the memory cell connected to the selected word line. Also, there will be some selected NAND strings for which the channel 491 should be connected to the respective bit lines. For such selected NAND strings, the drain side select gates should be conductive (in contrast to the drain side select gates of the unselected NAND string). In some embodiments, 0V is applied to the selected bit line with V_SGD applied to the control terminals of the select gates (SGD0, SGD1, SGD2) of the drain side select transistors to connect the channel 491 to the selected bit line. However, the need to have some NAND string channels connected to their bit lines and others cut off from their bit lines restricts the ability to modify V_BL and/or V_SGD to mitigate the program disturb to the dummy select gates. In some embodiments, V_SGDT has a positive Tco, which mitigates program disturb to the dummy select gates.

Recall that the source end of the NAND string may also have a dummy select gate. Those source side dummy select gate may also suffer from a temperature dependent program disturb. The disturb may be worse at lower temperatures. In some embodiments, the voltage applied to, for example, SGSB0 and SGSB1 during a program operation has a positive Tco, which mitigates program disturb to the source side dummy select gate.

Figure 10A:
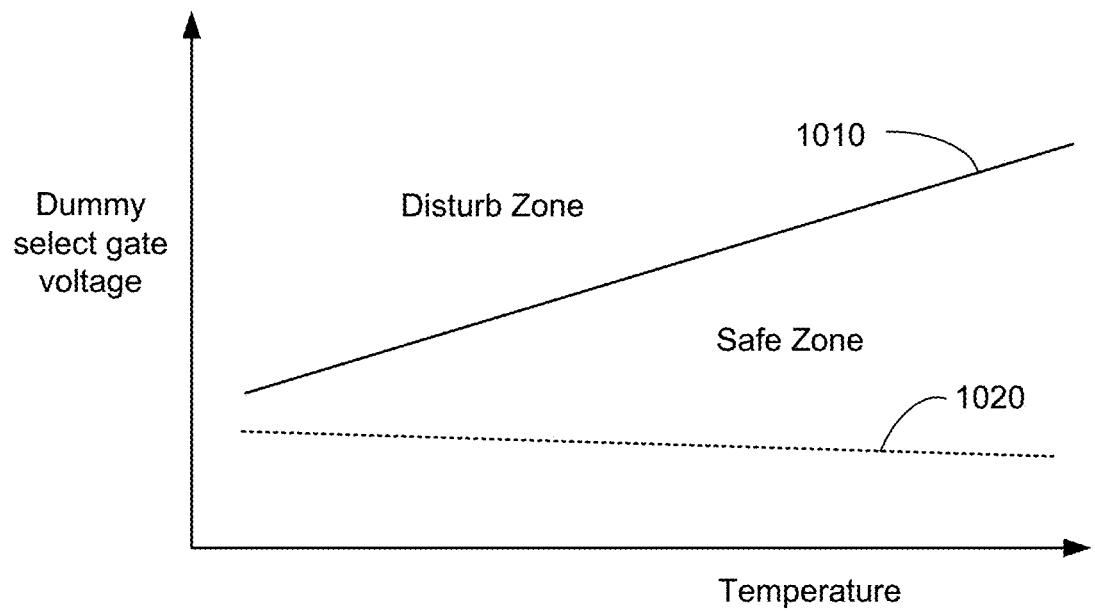
FIG. 10A is a graph showing a plot of one embodiment of dummy select gate voltage versus temperature.

FIG. 10A is a graph showing a plot 1020 of one embodiment of dummy select gate voltage versus temperature. The plot 1010 has a positive Tco. In other words, as the temperature increases the voltage increases. The plot 1010 in FIG. 10A shows a linear dependency on temperature, but the dependency is not required to be linear. In one embodiment, the slope for plot 1010 may be worked out based on an analysis of the program disturb as a function of temperature.

FIG. 10A roughly indicates a disturb zone above the plot 1010 and a safe zone below the plot 1010. The disturb zone indicates a combination of dummy select gate voltage (e.g., V_SGDT) and temperature that has a significant risk of program disturb to the dummy select gate. Note that the combination of a high dummy select gate voltage at a low temperature may be the worst case for program disturb. On the other hand, the safe zone indicates a combination of dummy select gate voltage (e.g., V_SGDT) and temperature that has a low risk of program disturb to the dummy select gate. Note that the dummy select gate voltage can have a greater magnitude at higher temperatures and still be in the safe zone.

FIG. 10A also shows a plot 1020 of the Vt of the dummy select gate versus temperature. The plot 1020 is for fresh dummy select gates, with no program disturb. The slope of plot 1020 indicates a slight negative dependence of the Vt on the temperature. Because the dummy select gates are to be on during operations such as program and read, the dummy select gate voltage is kept above the Vt of the dummy select gate during operations such as program and read.

Figure 10B:
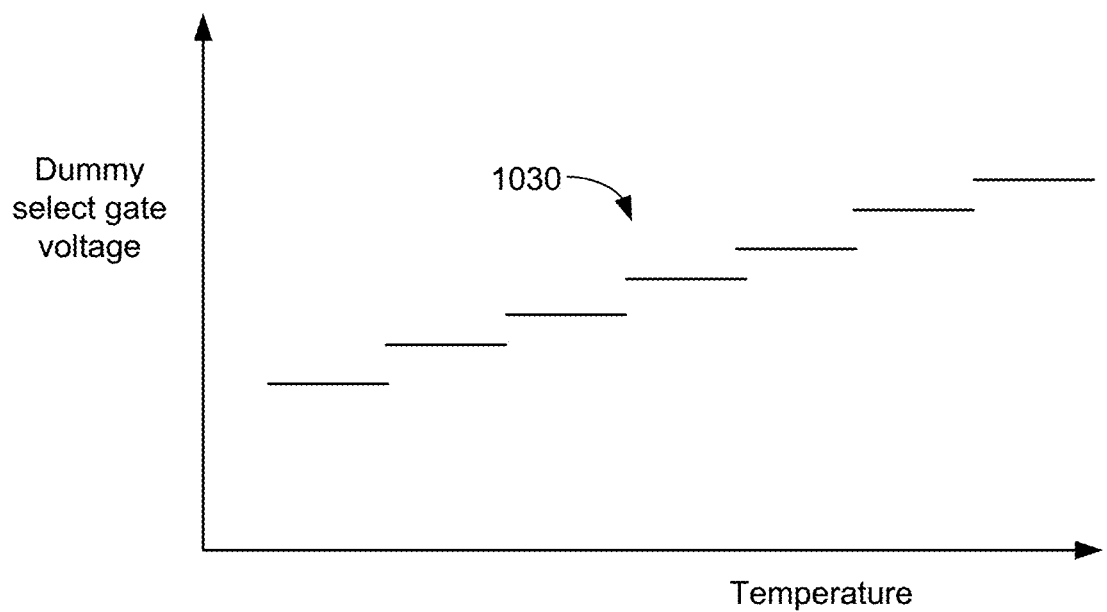
FIG. 10B is a graph showing a plot of another embodiment of dummy select gate voltage versus temperature.

In some embodiments, a table driven approach is used for the positive Tco of the dummy select gate voltage. FIG. 10B shows a plot 1030 in which the voltage has a number of discrete magnitudes for various temperature ranges. The table may be stored in storage 266 when the die is powered on.

Figure 11:
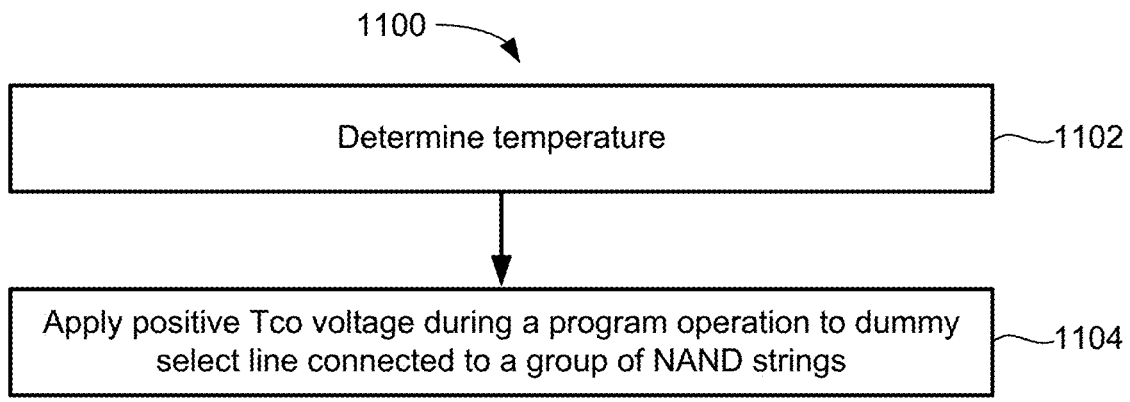
FIG. 11 is a flowchart of an embodiment of a process of applying voltages to dummy select gates during a program operation.

FIG. 11 is a flowchart of an embodiment of a process 1100 of applying voltages to dummy select gates during a program operation. Process 1100 mitigates program disturb to the dummy select gates. Process 1100 may be performed by a combination of memory controller 120, system control logic 260, and/or row control circuitry 220, which as noted above may be referred to as a control circuit. Process 1100 may be used when programming a group of NAND strings, which may reside in a 3D memory structure. Each NAND string may have non-volatile storage cells and one or more dummy select gates. Each NAND string may be associated with two conductive lines, which are referred to herein as a bit line and a source line. In an embodiment, a dummy select gate at one end of the NAND string is connected to the bit line and a dummy select gate at the other end of the NAND string is connected to the source line.

Step 1102 includes determining a present temperature with respect to 3D memory structure. The present temperature may be sensed at or near the 3D memory structure. In an embodiment, the temperature is determined by temperature sensor 228. In one embodiment, the temperature sensor 228 resides on the memory die 200. Note that in this case the temperature sensor may be in circuitry that is peripheral to the memory structure 202. In one embodiment, the temperature sensor 228 resides on the control die 211. Note that in this case the temperature sensor may be on a semiconductor die that is attached to the memory structure die 201 that contains the memory structure 202. With respect to the integrated memory assemblies 207 in FIGS. 3A and 3B, there could be a single temperature sensor on one of the dies that is used to sense the temperature for other dies.

Step 1104 includes applying a positive Tco voltage to a dummy select line connected to a group of NAND strings. The dummy select line is connected to control terminals (e.g., control gate) of dummy select transistors. The positive Tco voltage is applied during a program operation of non-volatile memory cells on the group of NAND strings. In an embodiment, the positive Tco voltage is applied to the dummy select line while a program voltage is applied to a selected word line connected to the group of NAND strings. The group of NAND strings may be those in a sub-block (see FIG. 4H for an example of sub-blocks). In step 1104, the positive Tco voltage may be applied to a drain side dummy select line and/or a source side dummy select line. With reference to FIG. 4H, the positive Tco voltage may be applied to SGDT-s0 when sub-block s0 is selected for programming. The positive Tco voltage may also be applied to dummy select lines in unselected sub-blocks. For example, the positive Tco voltage may be applied to SGDT-s1, SGDT-s2, SGDT-s3, SGDT-s4, and SGDT-s5. With reference to FIG. 4H, the positive Tco voltage may be applied to SGSB.

In step 1104, the dummy select gates will be on (e.g., conductive) as a result of the positive Tco voltage. Hence, the magnitude of the positive Tco voltage will be greater than the Vt of the dummy select gates. The Vt of the dummy select gates will depend on factors such as doping level of the channel of the respective dummy select transistors. In some embodiments, a higher concentration of an n-type dopant such as Phosphorus will result in a lower Vt. It is possible for the Vt to be negative; however, the Vt can also be positive. In some embodiments, the lowest voltage in step 1104 is about 0V. In some embodiments, the lowest voltage is about 2 or 3 volts. In some embodiments, the highest voltage is about 6 or 7 volts. However, the voltages will depend on the architecture (e.g., doping levels of the channels of the dummy select gates).

In one embodiment, the positive Tco voltage is applied to the dummy select line at least during a program phase of a program operation. In one embodiment, the voltage on the dummy select line is raised to the positive Tco voltage at the beginning of the programming operation and maintained at the same level throughout the programming operation. During step 1104, the system also applies voltages to bit lines, drain side select lines, a source side select line, dummy word lines, and data word lines.

Figure 12:
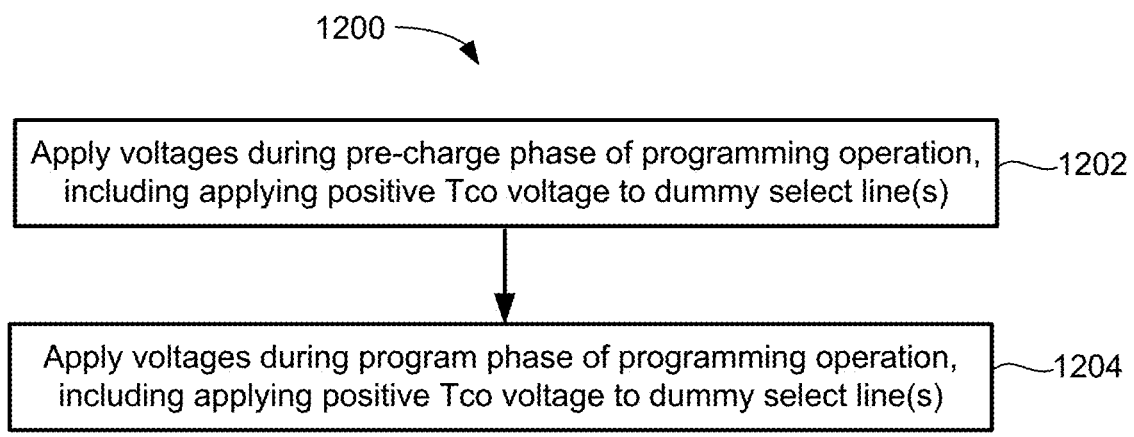
FIG. 12 is a flowchart of an embodiment of a process of applying voltages during a phases of a program operation.
Figure 13:
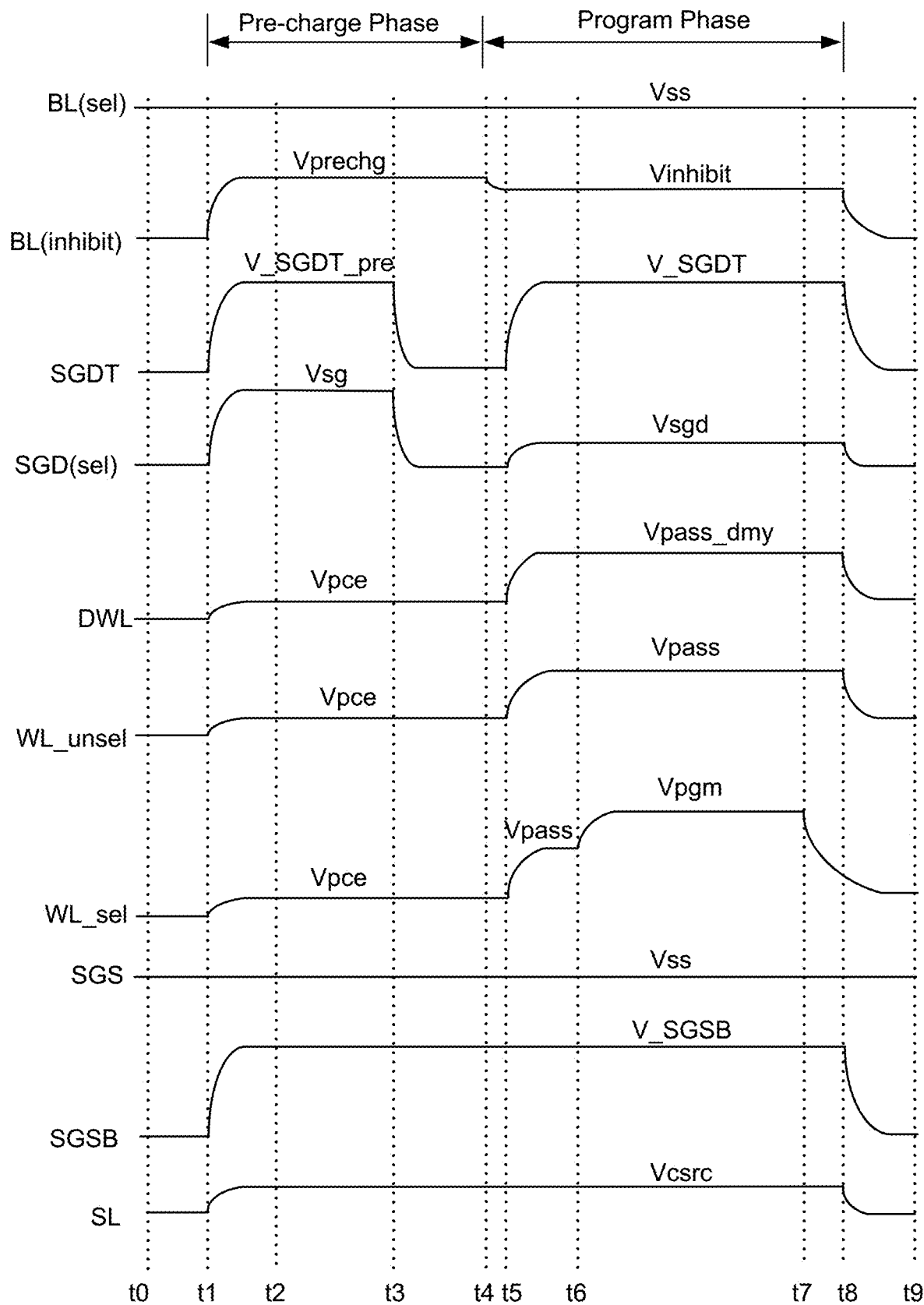
FIG. 13 depicts timing of voltages during an embodiment of programming.

In some embodiments, a program operation has a pre-charge phase and a program phase. FIG. 12 is a flowchart of an embodiment of a process 1200 of applying voltages during a program operation of non-volatile memory cells on a group of NAND strings. Process 1200 describes further details for one embodiment of step 1104 in process 1100. FIG. 13 depicts timing of voltages applied during one embodiment of a program operation. FIG. 13 depicts voltage waveforms during a pre-charge phase (e.g., t1-t4) and a program phase (e.g., t4-t8). FIG. 13 will be referred to when discussing process 1200. However, there are many other possible ways in which the voltages can be applied during a program operation such as process 1200.

Step 1202 includes applying voltages during a pre-charge phase of the program operation. The pre-charge phase is used to pre-charge the channels of unselected NAND strings. In the example waveforms of FIG. 13, the channels are pre-charged from the bit line. Optionally, the channels could be pre-charged from the source line instead of from the bit line when, for example, programming a lower tier in a multitier architecture.

These voltages in step 1202 include applying a positive Tco voltage to a dummy select line connected to the group of NAND strings. Referring to FIG. 13, at t1 the voltage on SGDT is raised to V_SGDT_pre. The voltage on SGDT will be held at V_SGDT_pre until t3. In an embodiment, the magnitude of V_SGDT_pre depends on the present temperature. In an embodiment, the magnitude of V_SGDT_pre is sufficiently great such that the dummy drain side select gates are conductive. Although FIG. 13 depicts the voltage on SGDT rising at t1, with some architectures at a low temperature, the voltage on SGDT could remain at about 0V throughout programming (if the Vt of the dummy select gate transistor is negative).

During the pre-charge phase, the selected bit lines are at a program enable voltage. A selected bit line refers to a bit line that is connected to at least one NAND string having a memory cell to receive programming. The voltage on the selected bit line may be kept at this program enable voltage throughout the pre-charge phase, as well as during a program phase. The program enable voltage will enable programming of a selected memory cell during the programming phase. With reference to FIG. 13, the voltage on the selected bit lines (BL(sel)) is kept at Vss from time t0 to t9. Vss is 0V, in one embodiment.

During the pre-charge phase, the inhibited (or unselected) bit lines are at a pre-charge voltage. An inhibited bit line refers to a bit line that is connected to a NAND string having a memory cell whose control gate is connected to the selected word line, but that is to be inhibited from programming. The voltage on the inhibited bit lines is raised to the pre-charge voltage (Vprechg) at t1 and held at Vprechg until t4. An example of Vprechg is about 2V to 5V.

During the pre-charge phase, the voltages on the dummy word lines (DWL), unselected word lines (WL_unsel), and the selected word line (WL_sel) may be at a pre-charge enable voltage (Vpce). With respect to FIG. 13, the voltages on the dummy word lines, unselected word lines, and the selected word line are raised to a pre-charge enable voltage (Vpce) at t1. An example, of Vpce is about 0.5V.

The voltage on the drain side select line that connects to the NAND strings that are selected for programming (SGD (sel)) is raised to Vsg at t1 and lowered from Vsg to ground at t3. An example of Vsg is about 6V.

FIG. 13 also depicts voltages applied to the source side select line (SGS), the dummy source side select line (SGSB) and the source line (SL). The voltage on SGS is held at Vss (e.g., 0V) from t0 to t9. The voltage on SL is raised to Vcrsc at t1. An example of Vcrsc is about 2.5 to 3.5V. The voltage on SGSB is raised to V_SGSB at t1 and held there until t8. In an embodiment, the magnitude of V_SGSB depends on the present temperature. In an embodiment, the magnitude of V_SGSB is sufficiently great such that the dummy source side select gates are conductive. Although FIG. 13 depicts the voltage on SGSB rising at t1, with some architectures at a low temperature, the voltage on SGSB could remain at about 0V throughout programming (if the Vt of the dummy select gate transistor is negative).

Step 1204 includes applying voltages during a program phase of the program operation. These voltages include applying the positive Tco voltage to one or more dummy select lines connected to the group of NAND strings. Referring to FIG. 13, the voltage on SGDT is raised to V_SGDT during the program phase. That is, the voltage is raised to V_SGDT at t5 and held there until t8. The magnitude of V_SGDT depends on the present temperature. The magnitude of V_SGDT may be the same or different from the magnitude of V_SGDT_pre. Likewise, the voltage on SGSB is maintained at V_SGSB during the program phase. Note that there are other possible timing sequences that may be used for SGDT and SGSB during the program operation.

At t4, the voltage on the inhibited bit lines is lowered from Vprechg to Vinhibit. An example of Vinhibit is between 1V to 3.5V). At t5, the voltage on the dummy word lines are raised to a dummy word line boosting voltage (Vpass_dmy). An example of Vpass_dmy is between about 4V to 6V. At t5, the voltage on the unselected word lines and the selected word line are raised to a word line boosting voltage (Vpass). An example of Vpass is between 6V to 10V. The magnitude of Vpass can differ between word lines. At t6, the voltage on the selected word line is raised from Vpass to a program voltage (Vpgm). At t8, the voltages are returned to their original voltages.

Figure 14:
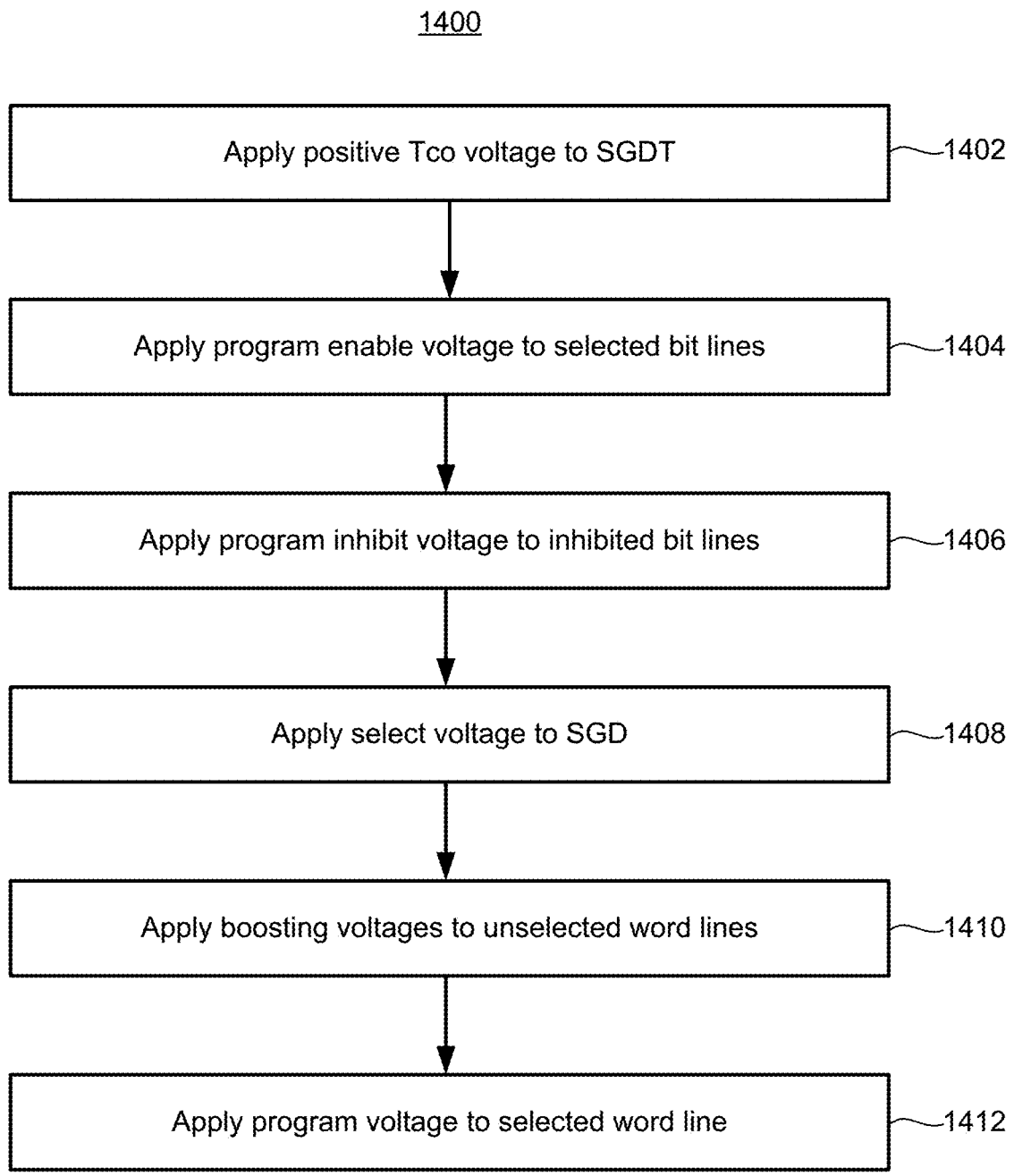
FIG. 14 is a flowchart of an embodiment of a process of applying voltages during a program operation.

FIG. 14 is a flowchart of an embodiment of a process 1400 of applying voltages to various lines during a program operation. Process 1400 describes further details of voltages applied during an embodiment of process 1200. Process 1400 will be described with respect to voltages applied between t6 and t7 in FIG. 13. However, the voltages between t6 and t7 in FIG. 13 are only one example of possible voltages. Step 1402 includes applying a positive Tco voltage to SGDT. With respect to FIG. 13, V_SGDT is applied to SGDT between t6 and t7. Step 1404 includes applying a program enable voltage to selected bit lines. With respect to FIG. 13, Vss (e.g., 0V) is applied to BL(sel) between t6 and t7. Step 1406 includes applying a program inhibit voltage to inhibited bit lines. With respect to FIG. 13, Inhibit (e.g., 2.5V) is applied to BL(inhibit) between t6 and t7. Step 1408 includes applying a a select voltage to SGD. With respect to FIG. 13, Vsgd is applied to SGD(sel) between t6 and t7. Step 1410 includes applying boosting voltages to unselected word lines connected to the group of NAND strings. With respect to FIG. 13, Vpass is applied to WL_unsel between t6 and t7. Also, with respect to FIG. 13, Vpass_dmy is applied to DWL between t6 and t7. Step 1412 includes applying a program voltage to the selected word line connected to the group of NAND strings. With respect to FIG. 13, Vpgm is applied to WL_sel between t6 and t7.

In one embodiment, the voltage applied to a dummy select gate during a read operation has a positive dependence on temperature.

Figure 15:
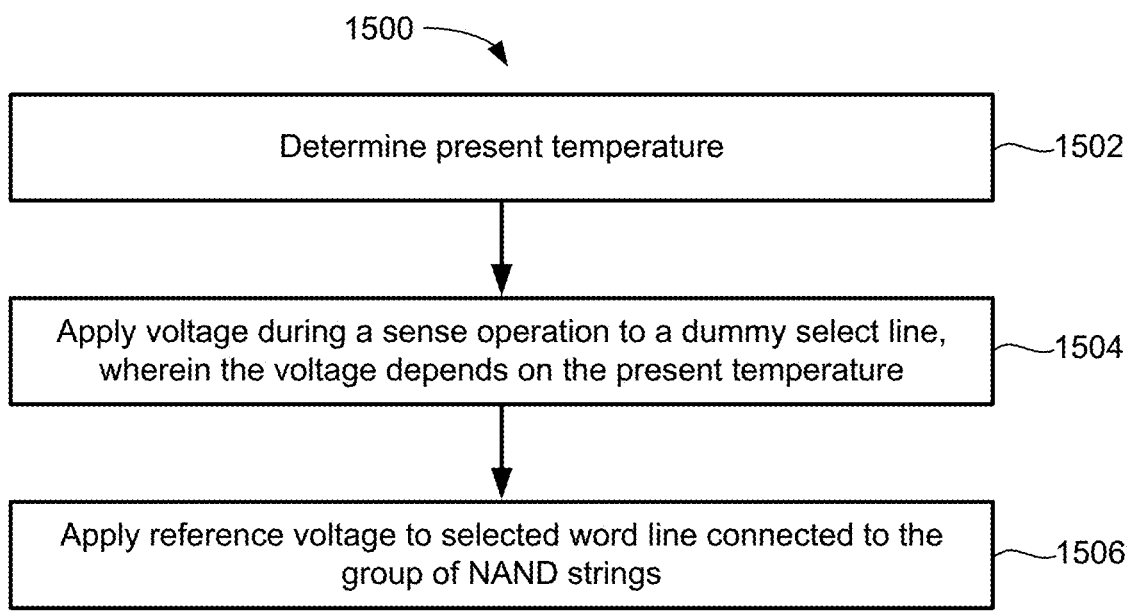
FIG. 15 is a flowchart of an embodiment of a process of applying voltages to dummy select gates during a sense operation.

FIG. 15 is a flowchart of an embodiment of a process 1500 of applying voltages to dummy select gates during a sense operation. In an embodiment, the sense operation is a read operation. In an embodiment, the sense operation is a verify operation. Process 1500 may be performed by a combination of memory controller 120, system control logic 260, column control circuitry 210 and/or row control circuitry 220, which as noted above may be referred to as a control circuit. Process 1500 may be used when sensing a group of NAND strings, which may reside in a 3D memory structure. Each NAND string may have non-volatile storage cells and one or more dummy select gates. Each NAND string may be associated with two conductive lines, which are referred to herein as a bit line and a source line. In an embodiment, a dummy select gate at one end of the NAND string is connected to the bit line and a dummy select gate at the other end of the NAND string is connected to the source line.

Step 1502 includes determining a present temperature of the 3D memory structure. The present temperature may be sensed at or near the 3D memory structure. In an embodiment, the temperature is determined by temperature sensor 228. In one embodiment, the temperature sensor 228 resides on the memory die 200. Note that in this case the temperature sensor may be in circuitry that is peripheral to the memory structure 202. In one embodiment, the temperature sensor 228 resides on the control die 211. Note that in this case the temperature sensor may be on a semiconductor die that is attached to the memory structure die 201 that contains the memory structure 202. With respect to the integrated memory assemblies 207 in FIGS. 3A and 3B, there could be a single temperature sensor on one of the dies that is used to sense the temperature for other dies.

Step 1504 includes applying a voltage to a dummy select line connected to a group of NAND strings, wherein the voltage depends on the present temperature. The group of NAND strings may be those in a sub-block (see FIG. 4H). In step 1504, the voltage may be applied to a drain side dummy select line and/or a source side dummy select line. With reference to FIG. 4H, the voltage may be applied to SGDT-s0 when sub-block s0 is selected for programming. The voltage may also be applied to dummy select lines in unselected sub-blocks. For example, the voltage may be applied to SGDT-s1, SGDT-s2, SGDT-s3, SGDT-s4, and SGDT-s5. With reference to FIG. 4H, the voltage may be applied to SGSB.

Step 1506 includes applying a reference voltage to a selected word line connected to the group of NAND strings. Selected memory cells are sensed in response to the reference voltage. For example, a NAND string current may be sensed. In a three bit per cell read embodiment, one or more of the voltages VrA-VrG (see FIG. 5B) may be applied to the selected word line. For example, the reference voltages that are needed to read a page of data may be applied to the selected word line in succession. The process may be used to read memory cells that have been programmed to more or fewer than three bits. In a verify embodiment, one or more of the voltages VvA-VvG may be applied to the selected word line. The process may be used to in the verify phase of a programming process that programs memory cells to more or fewer than three bits per cell.

A first embodiment includes a non-volatile storage apparatus comprising a control circuit configured to connect to a three dimensional memory structure having a plurality of conductive lines and a plurality of NAND strings associated with the plurality of conductive lines. Each NAND string comprises non-volatile storage cells and a dummy select gate. Each dummy select gate has a control terminal. Each dummy select gate is connected to one of the conductive lines. The control circuit is configured to determine a present temperature with respect to the three dimensional memory structure. The control circuit is configured to apply a voltage having a positive temperature coefficient to the control terminals of respective dummy select gates of a group of the NAND strings during a program operation.

In a second embodiment, in furtherance to the first embodiment, the control circuit is further configured to apply an erase voltage to the plurality of conductive lines during an erase operation. The control circuit is further configured to apply a voltage during the erase operation to the control terminals of respective dummy select gates of the group of the NAND strings to cause the dummy select gates to generate gate induced drain leakage (GIDL) current.

In a third embodiment, in furtherance to the first or second embodiments, each respective dummy select gate comprises a depletion mode transistor whose gate is the control terminal of the respective dummy select gate. The control circuit is configured to apply the voltage having the positive temperature coefficient to the gates of the respective depletion mode transistors of the group of the NAND strings during the program operation.

In a fourth embodiment, in furtherance to any of the first to third embodiments, each respective dummy select gate comprises an n-type depletion mode MOSFET transistor whose gate is the control terminal of the respective dummy select gate. The control circuit is configured to apply the voltage having the positive temperature coefficient to the gates of respective n-type depletion mode MOSFET transistors of the group of the NAND strings during the program operation.

In a fifth embodiment, in furtherance to the fourth embodiment, the plurality of conductive lines comprise a plurality of bit lines. Each dummy select gate is connected to one of the bit lines. The control circuit is configured to apply the voltage having the positive temperature coefficient to the control terminals of respective dummy select gates connected to one of the bit lines during the program operation.

In a sixth embodiment, in furtherance to the fifth embodiment, the control circuit is further configured to apply a program enable voltage to selected bit lines during the program operation. The control circuit is further configured to apply a program inhibit voltage to inhibited bit lines during the program operation. The control circuit is further configured to apply a voltage to regular select gates of the group of the NAND strings to either connect a channel of a NAND string to its respective bit line or to cut off the channel of the NAND string from its respective bit line during the program operation.

In a seventh embodiment, in furtherance to any of the first to sixth embodiments, the control circuit is configured to apply the voltage having the positive temperature coefficient to the control terminals of the respective dummy select gates of the group of the NAND strings while the control circuit applies a program voltage to non-volatile storage cells on the group of NAND strings.

In an eighth embodiment, in furtherance to any of the first or to seventh embodiments, the plurality of conductive lines comprise a plurality of source lines. Each dummy select gate is connected to one of the source lines. The control circuit is configured to apply the voltage having the positive temperature coefficient to the control terminals of respective dummy select gates connected to one of the source lines during the program operation.

In a ninth embodiment, in furtherance to any of the first or to the eighth embodiments, the control circuit is further configured to apply a voltage having a positive temperature coefficient to the control terminals of the dummy select gates of the group of the NAND strings during a sense operation.

One embodiment includes a method of operating non-volatile storage. The method comprises determining a present temperature of a three-dimensional memory structure that comprises NAND strings. Each NAND string comprises a depletion mode transistor and non-volatile memory cells. The method comprises applying a voltage to respective control terminals of the depletion mode transistors of a group of the NAND strings during a program operation, the voltage having a magnitude that depends positively on the present temperature of the three-dimensional memory structure.

One embodiment includes a non-volatile storage system comprising a plurality of conductive lines, a three-dimensional memory structure, and a control circuit. The three-dimensional memory structure comprises a plurality of NAND strings and a plurality of word lines. Each of the NAND strings comprises a plurality of non-volatile memory cells and a gate induced drain leakage (GIDL) transistor at an end of the NAND string that is connected to one of the conductive lines. The control circuit applies a voltage between control terminals of respective GIDL transistors of a group of the NAND strings and the conductive lines at the end of the NAND strings having the respective GIDL transistors to generate gate induced drain leakage (GIDL) currents during an erase operation. The control circuit applies a program voltage to a selected word line connected to the group of NAND strings during a program operation. The control circuit applies a voltage that has a positive dependence on temperature to the control terminals of the respective GIDL transistors of the group of NAND strings while the program voltage is applied to the selected word line during the program operation.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
    a control circuit configured to connect to a three dimensional memory structure having a plurality of conductive lines and a plurality of NAND strings associated with the plurality of conductive lines, each NAND string comprising non-volatile storage cells and a dummy select gate and a regular select gate, each dummy select gate having a control terminal, wherein each dummy select gate is connected to one of the conductive lines, wherein the regular select gate is between the dummy select gate and the non-volatile storage cells of the NAND string;
wherein the control circuit is configured to:
determine a present temperature with respect to the three dimensional memory structure; and
apply a voltage having a positive temperature coefficient to the control terminals of respective dummy select gates of a group of the NAND strings during a program operation.

2. The non-volatile storage apparatus of claim 1, wherein the control circuit is further configured to:
apply an erase voltage to the plurality of conductive lines during an erase operation; and
apply a voltage during the erase operation to the control terminals of respective dummy select gates of the group of the NAND strings to cause the dummy select gates to generate gate induced drain leakage (GIDL) current.

3. The non-volatile storage apparatus of claim 1, wherein:
each respective dummy select gate comprises a depletion mode transistor whose gate is the control terminal of the respective dummy select gate; and
the control circuit is configured to apply the voltage having the positive temperature coefficient to the gates of the respective depletion mode transistors of the group of the NAND strings during the program operation.

4. The non-volatile storage apparatus of claim 1, wherein:
each respective dummy select gate comprises an n-type depletion mode MOSFET transistor whose gate is the control terminal of the respective dummy select gate; and
the control circuit is configured to apply the voltage having the positive temperature coefficient to the gates of respective n-type depletion mode MOSFET transistors of the group of the NAND strings during the program operation.

5. The non-volatile storage apparatus of claim 1, wherein:
the plurality of conductive lines comprise a plurality of bit lines, wherein each dummy select gate is connected to one of the bit lines; and
the control circuit is configured to apply the voltage having the positive temperature coefficient to the control terminals of respective dummy select gates connected to one of the bit lines during the program operation.

6. The non-volatile storage apparatus of claim 5, wherein the control circuit is further configured to:
apply a program enable voltage to selected bit lines during the program operation;
apply a program inhibit voltage to inhibited bit lines during the program operation; and
apply a voltage to the regular select gates of the group of the NAND strings to either connect a channel of a NAND string to its respective bit line or to cut off the channel of the NAND string from its respective bit line during the program operation.

7. The non-volatile storage apparatus of claim 1, wherein the control circuit is configured to:
apply the voltage having the positive temperature coefficient to the control terminals of the respective dummy select gates of the group of the NAND strings while the control circuit applies a program voltage to non-volatile storage cells on the group of NAND strings.

8. The non-volatile storage apparatus of claim 1, wherein:
the plurality of conductive lines comprise a plurality of source lines, wherein each dummy select gate is connected to one of the source lines; and
the control circuit is configured to apply the voltage having the positive temperature coefficient to the control terminals of respective dummy select gates connected to one of the source lines during the program operation.

9. The non-volatile storage apparatus of claim 1, wherein the control circuit is further configured to apply a voltage having a positive temperature coefficient to the control terminals of the dummy select gates of the group of the NAND strings during a sense operation.

10. A method of operating non-volatile storage, the method comprising:
determining a present temperature of a three-dimensional memory structure that comprises NAND strings, each NAND string comprising a depletion mode transistor, an enhancement mode select transistor, and non-volatile memory cells, the enhancement mode select transistor between the depletion mode transistor and the non-volatile memory cells of the NAND string; and
applying a voltage to respective control terminals of the depletion mode transistors of a group of the NAND strings during a program operation, the voltage having a magnitude that depends positively on the present temperature of the three-dimensional memory structure.

11. The method of claim 10, further comprising:
applying an erase voltage during an erase operation to respective conductive lines connected to the depletion mode transistors on the group of the NAND strings; and
apply a voltage to the respective control terminals of the depletion mode transistors of the group of the NAND strings during the erase operation to cause the depletion mode transistors to generate gate induced drain leakage (GIDL) current during the erase operation.

12. The method of claim 10, further comprising:
applying a program enable voltage during the program operation to bit lines connected to depletion mode transistors of a first set of the group of NAND strings;
applying a program inhibit voltage during the program operation to bit lines connected to depletion mode transistors of a second set of the group of NAND strings; and
applying a voltage during the program operation to respective select transistors on the group of NAND strings to connect NAND channels of the first set of the group of NAND string to respective bit lines and to cut off NAND channels of the second set of the group of NAND strings from the respective bit lines, wherein the select transistors each comprise an enhancement mode transistor.

13. The method of claim 10, further comprising:
applying a voltage during the program operation to a source line connected to the respective depletion mode transistors of the group of the NAND strings.

14. The method of claim 10, further comprising:
applying a voltage to the respective control terminals of the depletion mode transistor of the group of the NAND strings during a read operation, the voltage applied during the read operation having a magnitude that depends positively present temperature.

15. A non-volatile storage system comprising:
a plurality of conductive lines;

a three-dimensional memory structure comprising a plurality of NAND strings and a plurality of word lines, each of the NAND strings comprising a plurality of non-volatile memory cells, a regular select transistor, and a gate induced drain leakage (GIDL) transistor at an end of the NAND string that is connected to one of the conductive lines, the regular select transistor between the GIDL transistor and the non-volatile memory cells of the NAND string; and a control circuit that:

applies a voltage between control terminals of respective GIDL transistors of a group of the NAND strings and the conductive lines at the end of the NAND strings having the respective GIDL transistors to generate gate induced drain leakage (GIDL) currents during an erase operation;

applies a program voltage to a selected word line connected to the group of NAND strings during a program operation; and applies a voltage that has a positive dependence on temperature to the control terminals of the respective GIDL transistors of the group of the NAND strings while the program voltage is applied to the selected word line during the program operation.

16. The non-volatile storage system of claim 15, wherein each GIDL transistor comprises an n-type depletion mode transistor.

17. The non-volatile storage system of claim 15, wherein:
the plurality of conductive lines comprise a plurality of bit lines; and
a set of the GIDL transistors are at an end of respective NAND strings that are connected to one of the bit lines.

18. The non-volatile storage system of claim 17, wherein:
each respective NAND string further comprises a select transistor between the non-volatile memory cells of the respective NAND string and the GIDL transistor at the end of the respective NAND string connected to one of the bit lines;
the control circuit applies a voltage to a control terminal of the select transistor during the program operation;
the control circuit applies a program enable voltage to enabled bit lines to connect channels of selected NAND strings to the respective enabled bit lines during the program operation; and
the control circuit applies a program inhibit voltage to inhibited bit lines to cut off channels of unselected NAND string from the respective inhibited bit lines during the program operation.

19. The non-volatile storage system of claim 15, wherein:
the plurality of conductive lines comprise a plurality of source lines; and
a first set of the GIDL transistors are at a first end of respective NAND strings that are connected to one of the source lines.

20. The non-volatile storage system of claim 19, wherein:
the plurality of conductive lines further comprise a plurality of bit lines; and
a second set of the GIDL transistors are at a second end of respective NAND strings that are connected to one of the bit lines.

* * * * *